(12) United States Patent
Gaebler et al.

(10) Patent No.: US 8,350,209 B2
(45) Date of Patent: Jan. 8, 2013

(54) PRODUCTION OF SELF-ORGANIZED PIN-TYPE NANOSTRUCTURES, AND THE RATHER EXTENSIVE APPLICATIONS THEREOF

(75) Inventors: Daniel Gaebler, Ilmenau (DE); Konrad Bach, Tiefthal (DE)

(73) Assignee: X-FAB Semiconductor Foundries AG, Erfurt (DE)

( * ) Notice: Subject to any disclaimer, the term of this patent is extended or adjusted under 35 U.S.C. 154(b) by 967 days.

(21) Appl. No.: 12/089,727

(22) PCT Filed: Oct. 10, 2006

(86) PCT No.: PCT/EP2006/067249
§ 371 (c)(1),
(2), (4) Date: Sep. 19, 2008

(87) PCT Pub. No.: WO2007/042521
PCT Pub. Date: Apr. 19, 2007

(65) Prior Publication Data
US 2009/0261353 A1    Oct. 22, 2009

(30) Foreign Application Priority Data

| Oct. 10, 2005 | (DE) | 10 2005 048 359 |
| Oct. 10, 2005 | (DE) | 10 2005 048 360 |
| Oct. 10, 2005 | (DE) | 10 2005 048 361 |
| Oct. 10, 2005 | (DE) | 10 2005 048 362 |
| Oct. 10, 2005 | (DE) | 10 2005 048 363 |
| Oct. 10, 2005 | (DE) | 10 2005 048 365 |

(51) Int. Cl.
*H01J 3/14* (2006.01)
*H01J 5/16* (2006.01)

(52) U.S. Cl. .............. 250/216; 250/214.1; 250/214 R; 257/431

(58) Field of Classification Search ............. 250/201.1, 250/214.1, 214 R, 208.1, 216; 257/431
See application file for complete search history.

(56) References Cited

U.S. PATENT DOCUMENTS

| 4,717,448 | A  |    | 1/1988  | Cox et al. |
| 6,038,065 | A  |    | 3/2000  | Borden |
| 6,091,021 | A  |    | 7/2000  | Ruby et al. |
| 6,329,296 | B1 | *  | 12/2001 | Ruby et al. ............ 438/712 |
| 6,488,995 | B1 | *  | 12/2002 | Nishimoto et al. ....... 427/574 |

(Continued)

FOREIGN PATENT DOCUMENTS
DE    690 26 469 T2    4/1996
(Continued)

OTHER PUBLICATIONS

Jansen, De Boer, Otter, Elwenspoek; "The Black Silicon Method IV"; in: Micro Electro Mechanical Systems; 1995; IEEE; Jan. 29, 1995; pp. 88-93.

(Continued)

*Primary Examiner* — Francis M Legasse, Jr.
(74) *Attorney, Agent, or Firm* — Stevens & Showalter LLP

(57) ABSTRACT

The invention relates to methods and devices comprising a nanostructure (2;4,4a) for improving the optical behavior of components and apparatuses and/or improving the behavior of sensors by increasing the active surface area. The nanostructure (2) is produced by means of a special RIE etching process, can be modified regarding the composition of the materials thereof, and can be provided with adequate coatings. The amount of material used for the base layer (3) can be reduced by supplying a buffer layer (406). Many applications are disclosed.

9 Claims, 14 Drawing Sheets

U.S. PATENT DOCUMENTS

| | | |
|---|---|---|
| 6,946,362 B2 | 9/2005 | Gore et al. |
| 2002/0000244 A1 | 1/2002 | Zaidi |
| 2002/0022339 A1 | 2/2002 | Kirchhoff |
| 2005/0244324 A1 | 11/2005 | Hatta et al. |
| 2006/0251995 A1 | 11/2006 | Wille et al. |

FOREIGN PATENT DOCUMENTS

| | | |
|---|---|---|
| DE | 199 12 737 A1 | 6/2000 |
| DE | 100 36 725 C2 | 11/2002 |
| DE | 102 39 642 B3 | 6/2004 |
| DE | 102 39 643 B3 | 6/2004 |
| DE | 44 15 567 B4 | 11/2004 |
| DE | 103 52 423 B3 | 1/2005 |
| DE | 103 93 222 T5 | 9/2005 |
| EP | 0 427 395 B1 | 5/1991 |
| EP | 1 215 513 A1 | 6/2002 |
| EP | 1 536 461 A1 | 6/2005 |
| GB | 2 289 060 A1 | 11/1995 |
| WO | 96 08036 A1 | 3/1996 |
| WO | 02 13279 A2 | 2/2002 |
| WO | 02 13279 A3 | 2/2002 |
| WO | 2004 021452 A2 | 3/2004 |
| WO | 2005 045941 A2 | 5/2005 |
| WO | 2005 053037 A1 | 6/2005 |

OTHER PUBLICATIONS

De Rosa, Addonizio, Chiacchio, Roca, Tucci;: "Plasma Etching Conditioning of Textured Crystalline Silicon Surfaces . . . "; in: Mat. Res. Soc. Symp. Proc.; May 4, 1999; vol. 557; pp. 585-590.

Schnell, Lindemann, Schaefer; Plasma Surface Texturization for Multicrystalline Silicon Solar Cells; in: Photovoltaic Specialists Conference; 2000; IEEE; pp. 367-370.

Ruby, Zaidi, Narayanan; "Plasma-Texturization for Multicrystalline Silicon Solar Cells"; in: Photovoltaic Specialist Conference; 2000; IEEE; pp. 75-78.

Zaidi, Ruby,Gee; "Characterization of Random Reactive Ion Etched-Textured Silicon . . . "; in: IEEE Transactions on Electron Devices; vol. 48; No. 6; Jun. 2001; pp. 1200-1206.

Kanechia, Sugimoto, Mitsushima; "Study on a Condition for Forming the High Density of Silicon . . . "; in: Journal of Vac. Sci. Technol. B; vol. 20, Issue 5; Sep./Oct. 2002; pp. 1843-1846.

Kumaravelu, Alkaisi, Bittar; "Surface Texturing for Silicon Solar Cells Using Reactive Ion . . . "; in: Photovoltaic Specialist Conference; 2002; IEEE; pp. 258-261.

Jansen, De Boer, Legtenberg, Elvenspoek; "The Black Silicon Method: A Universal Method for Determining the Parameter Setting of a Fluorine-based Reactive Ion Etcher in Deep Silicon Trench Etching with Profile Control"; J. Micromech, Microeng.; vol. 5; 1995; pp. 115-120.

Wilson, Hutley; "The Optical Properties of "Moth Eye" Antireflection Surfaces"; Optica ACTA; vol. 29, No. 7; 1982; pp. 993-1009.

Bressers, Kelly, Gardeniers, Elvenspoek; "Surface Morphologie of p-Type (100) Silicon Etched in Aqueous Alkaline Solution"; J. Electrochem. Soc.; vol. 143, No. 5; May 1996; pp. 1744-1750.

Ehrlich, Hudda; "Atomic View of Surface Self-Diffusion: Tungsten on Tungsten*"; The Journal of Chemical Physics; vol. 44, No. 3; Feb. 1, 1966; pp. 1039-1049.

Deckmann, Dunsmuir; "Natural lithographie"; Appl. Phys. Lett. 41 (4); Aug. 15, 1982; pp. 377-379.

Bradley, Harper; "Theory of Ripple Topography Induced by Ion Bombardment"; J. Vac. Sci. Technol. A 6 (4); Jul./Aug. 1988; pp. 2390-2395.

Klopfenstein, P.; International Search Report for PCT/EP2006/067248—mailed Apr. 10, 2007.

Dreschers, Diana; Partial International Search Report for PCT/EP2006/067249—mailed Feb. 11, 2008.

Visentin, Alberto; International Search Report for PCT/EP2006/067249—mailed Mar. 3, 2008.

* cited by examiner

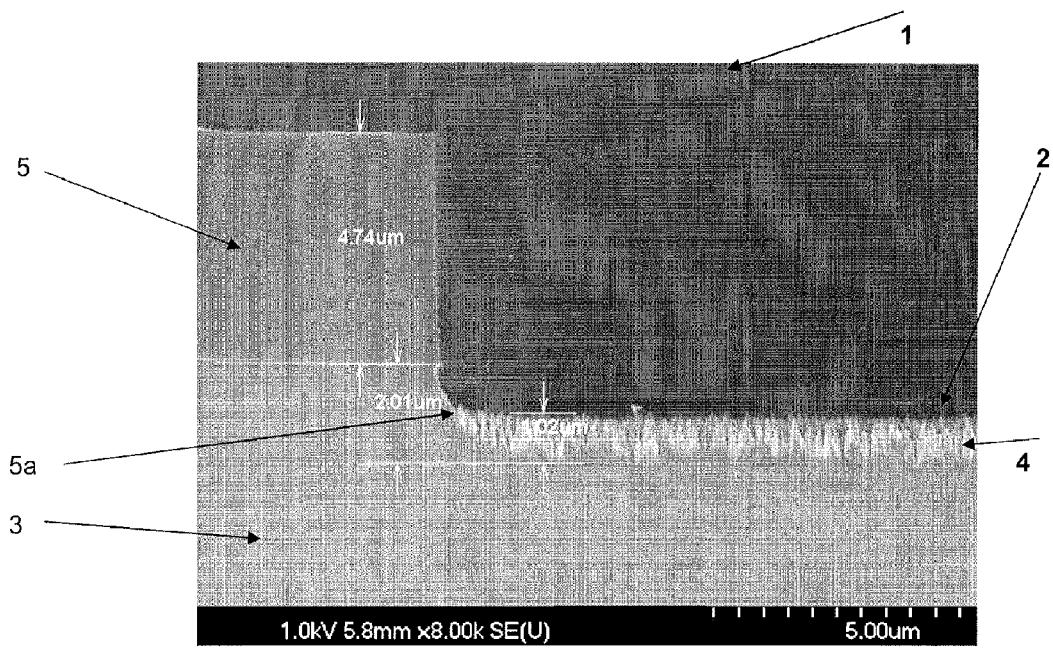
Fig. 1a
Fig. 1b
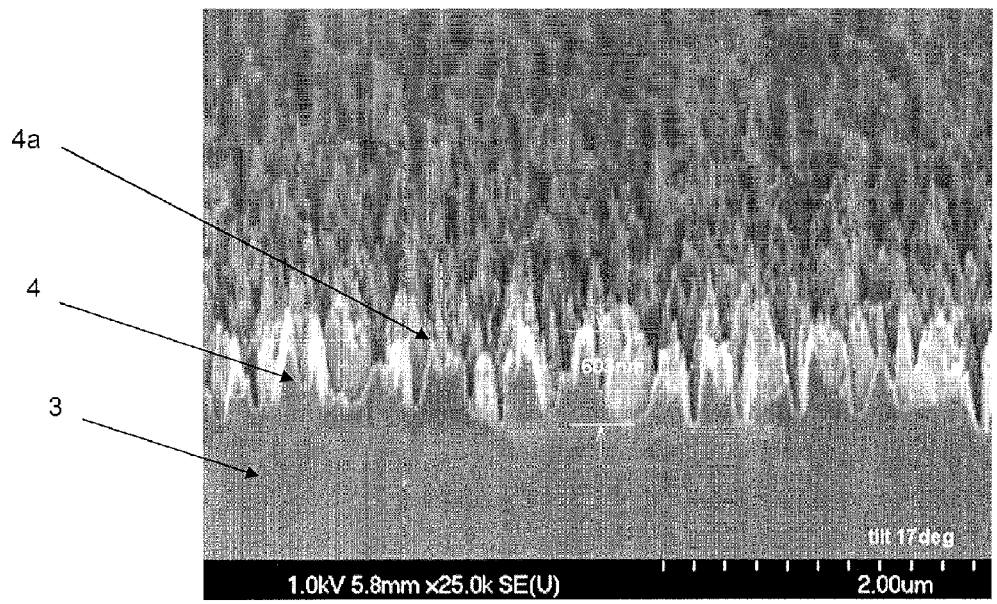

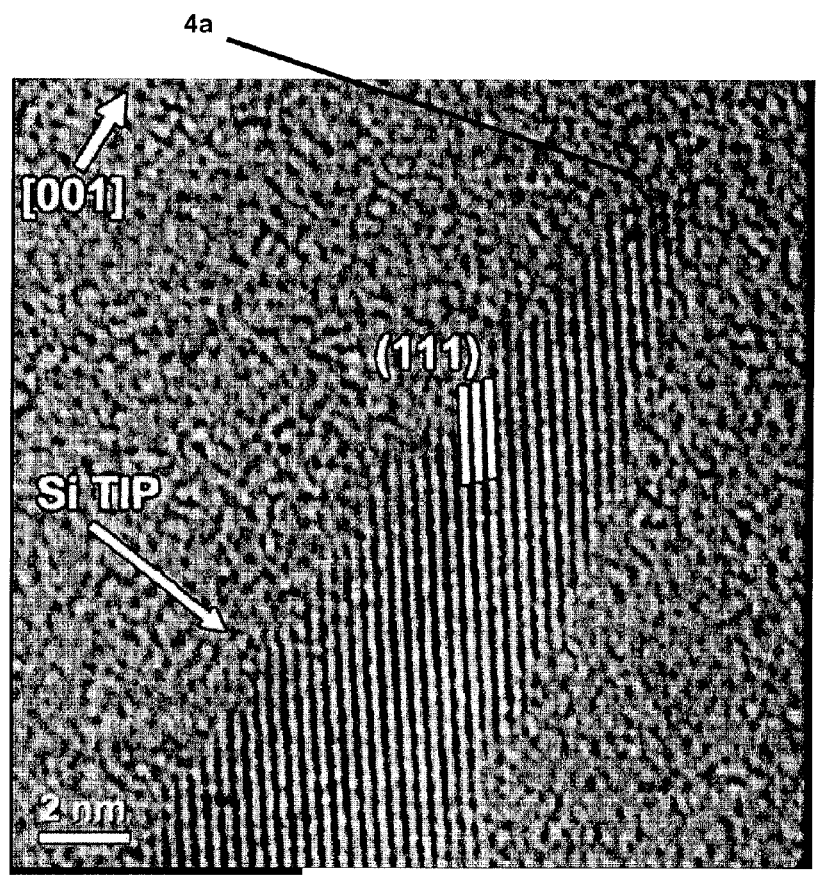
Fig. 1c
Fig. 1d
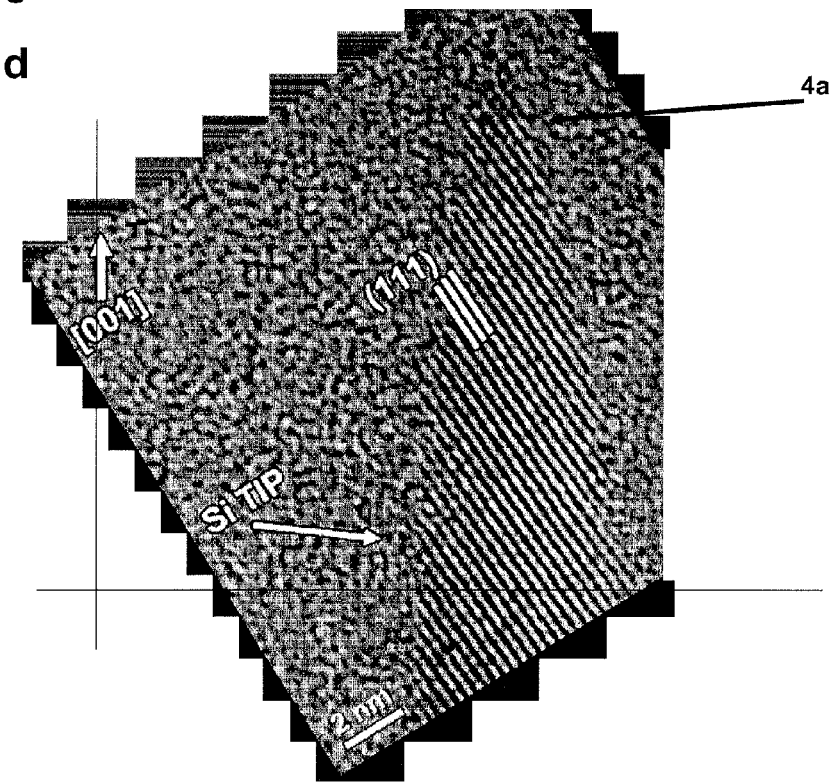

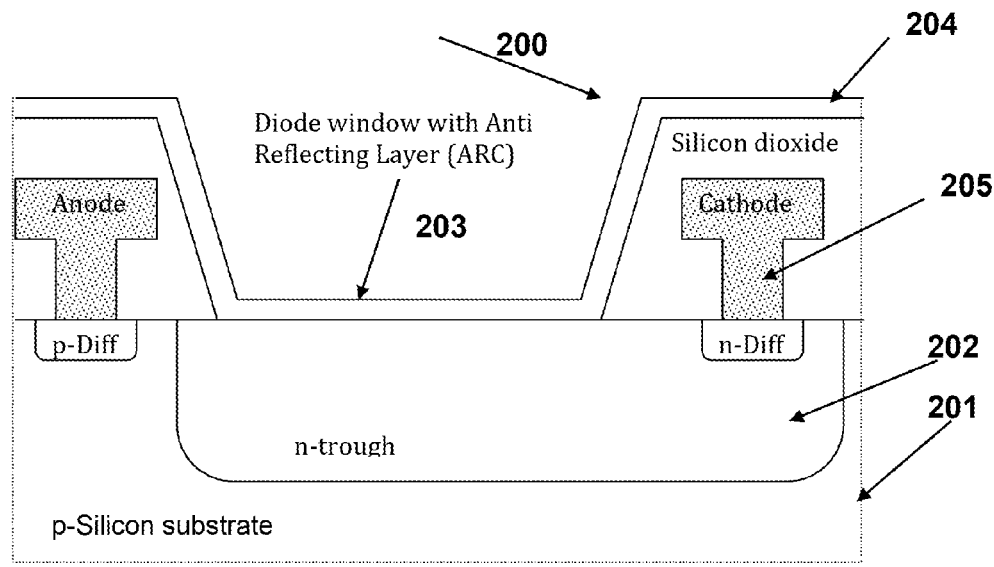
Fig. 2a
Fig. 2b
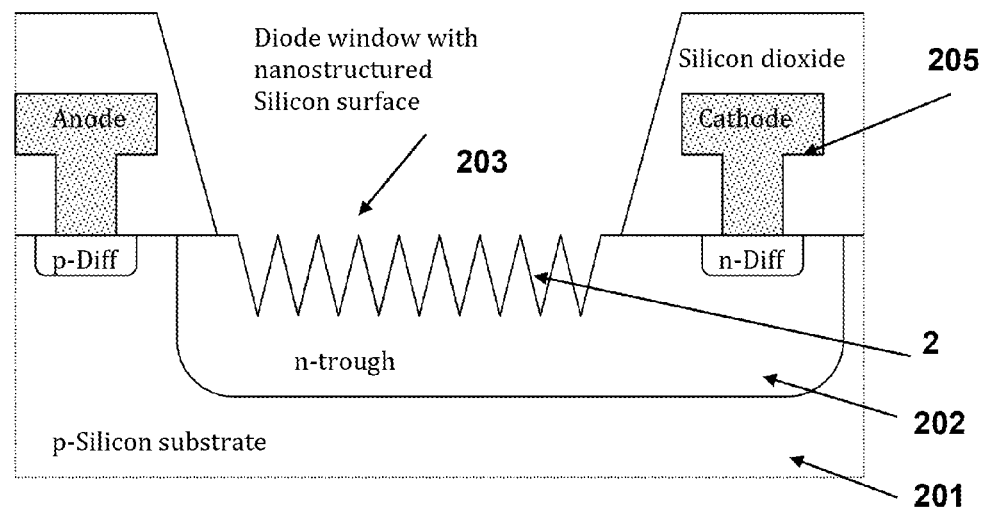

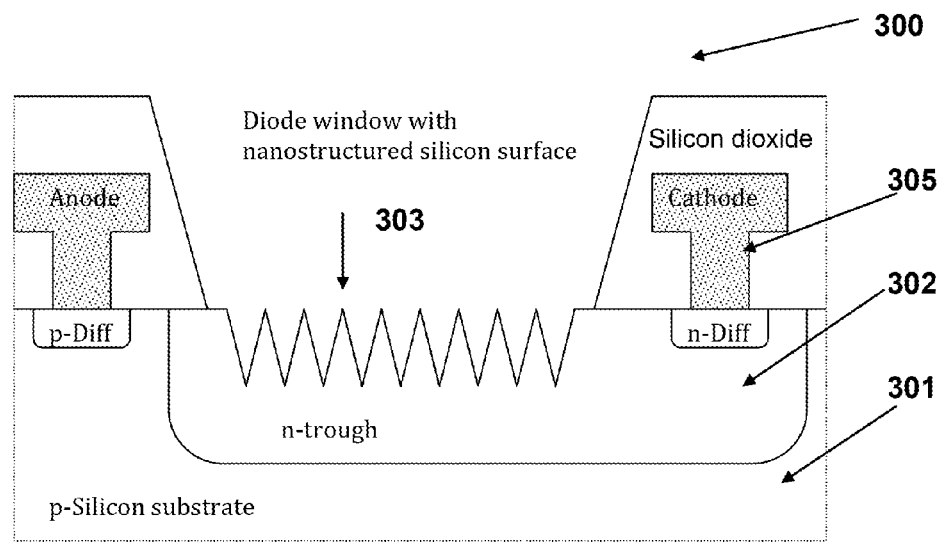
Fig. 3a
Fig. 3b
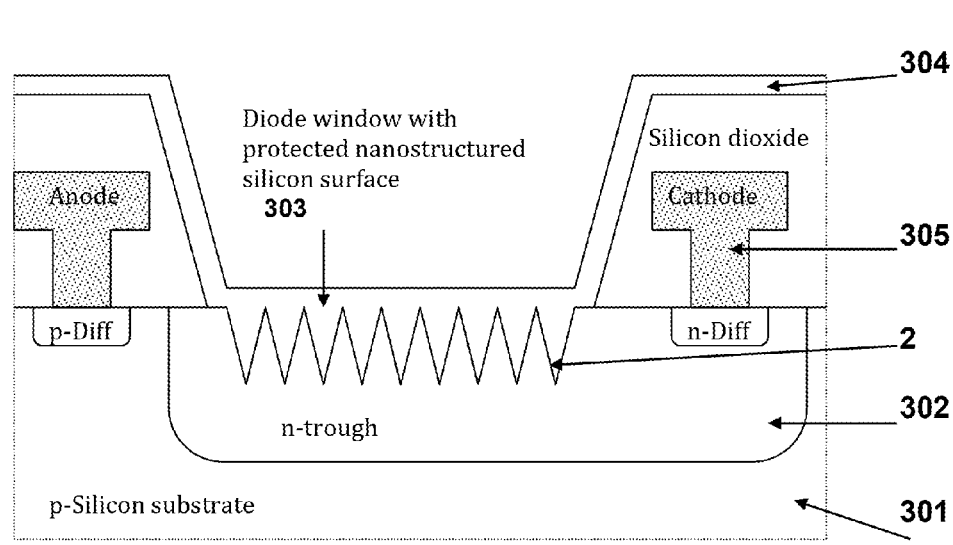

Fig. 4a
Fig. 4b
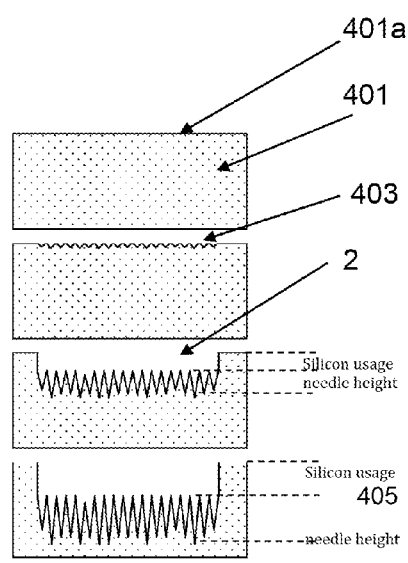
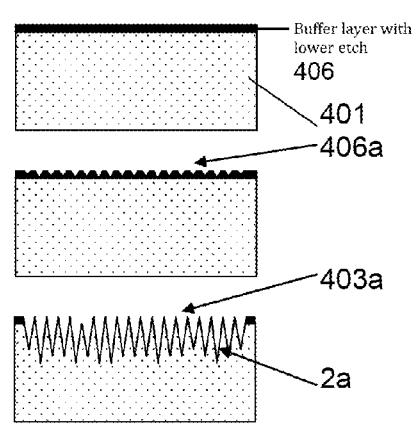

PRODUCTION OF SELF-ORGANIZED PIN-TYPE NANOSTRUCTURES, AND THE RATHER EXTENSIVE APPLICATIONS THEREOF

FIELD OF THE INVENTION(S)

Generally, the invention relates to the fabrication of structured or patterned surfaces and in particular relates to the production of pin type structures having nano dimensions in the range of for instance below the wavelength of visible light, wherein hereinafter these structures are referred to as nanostructures. The possibilities and technical applications of these structures are emphasized herein.

RELATED ART

Many electronic, opto-electronic, sensor and micromechanical devices comprise silicon as one component in doped and/or non-doped, crystalline and/or polycrystalline and/or amorphous form. In order to meet the device specific requirements silicon has usually to be processed in an appropriate manner, which frequently involves the patterning of the silicon.

For the patterning of silicon generally a mask made of photoresist is produced, with the aid of which material removal is controlled during an etch process. In order to produce small structures on the basis of a resist mask the photoresist has to be exposed by means of a photomask having respective small features. In the range below the usual light wavelengths that are available for the exposure of photoresist materials this may be accomplished only with increased effort. However, frequently structures having elements with a high aspect ratio are required, i.e. the depth or height of the structural elements is high compared to their lateral dimensions. If, for example, recesses and thus protrusions having nano dimensions are required on a silicon surface with an aspect ratio of 2 a local material removal has to be performed that results in a recessing of for example 200 nm for a lateral dimension of 100 nm. During an etch process on the basis of a photoresist mask this mask also has to be produced with comparable lateral dimensions and further has to provide for the required etch selectivity so as to obtain the desired aspect ratio during the subsequent silicon etch process. Alternatively, masks with high resolution may be produced by means of an electron beam (e beam). These solutions are widely applicable, however require high effort and are cost intensive. For this reason, continuously efforts are made to provide alternative methods that also enable the patterning at nanometer dimensions.

In many conventional techniques a high aspect ratio of the nanostructures is not achieved, in particular when concurrently a low defect density is desired. In prior art techniques the nanostructure typically exhibits an increased contamination density after production, that is, undesired impurities at the surface, and/or an increased number of crystal defects when initially a single crystalline silicon having a low crystal defect density has been provided. Therefore, these known techniques may be used in a limited manner and with an inferior result with respect to the overall performance of the device. In some of these conventional techniques or the microstructuring or patterning plasma enhanced techniques based on reactive ions, also known as RIE technique, have been used on the basis of $SF_6$ (sulphur hexafluorine) and oxygen by using self-organization in order to produce patterned silicon surfaces, wherein metal particles ensure the micro masking and thus the formation of a structure or pattern. (WO 02/13279A2, U.S. Pat. No. 6,091,021, U.S. Pat. No. 6,329,296).

A disadvantage of this method is the application of metals in the plasma, which may result in a non-desired contamination of the silicon. The disadvantageous influences of minute metal traces within the semiconductor production process, in particular for integrated circuits, are well known. In addition to the contaminating effects on the RIE tools due to adding of metal also the additional effort of these methods may be detrimental for an application in a production method that requires high yield and low production costs.

Due to the method specific difficulties of the conventional production of patterned surfaces and of the further processing thereof also an application of nanostructures in devices, such as sensors, optoelectronic components and the like in a cost-efficient and reliable manner is not widely spread up to date.

SUMMARY OF THE INVENTION

It is an object of the present invention to provide methods and devices wherein nanostructures may be integrated in a reliable and cost-efficient manner while concurrently ensuring an efficient further processing and gain in performance of the devices.

According to one aspect of the invention a method for anti-reflective coating of photoelectronic devices by self-organized nanostructures and corresponding devices are provided, wherein the production of appropriate nanostructures is based on a method that is described in detail also in the co-pending PCT patent application with the same filing date as the present application and with the application number PCT/EP2006/067248. Should any doubt arise in this application or if any supplement may be required, the cited PCT application may be referred to.

According to the invention an anti-reflective coating of photoelectronic devices, such as photo diodes, photo cells and the like as part of an integrated circuit or as a discrete device is not or not exclusively obtained by means of conventional λ quarter layers, but is obtained, alternatively or additionally, by nanostructures formed by means of RIE etching, which nanostructures provide for a significantly enhanced broadband characteristic.

Photosensitive devices in integrated circuits and in the form of discrete devices, such as photo cells, are used for converting light into electric energy or vice versa. For example, photo diodes convert light signals into electrical signals. For these photosensitive devices a high degree of sensitivity is desired. For instance, photo diodes represent a sensor device in microelectronics that may be integrated and whose area is to be provided as small as possible, or even minute light intensities should be detectable. Other devices than photo diodes should exhibit a high efficiency. In any case it is advantageous to maintain losses caused by reflections at a minimum. In principle, the conversion of the photons into electrons occurs in the semiconductor material itself, such as the silicon. The charge carriers are drained off by an electric field which is created by the pn junction. For this purpose the photons must first enter the semiconductor such as the silicon. Due to the pronounced difference of the impedances or indices of refraction of air and the semiconductor material, such as silicon, a large number of photons is however reflected at the interface and does not reach the location of the conversion. Thereby, the sensitivity of the photo diode or the efficiency of the photo cell is reduced.

In an integrated photo diode there is, however, no air/semiconductor transition since semiconductor devices are typically protected by a passivation layer. This is frequently an arrangement of air/SiO$_2$/Si or air/Si$_3$N$_4$/Si, if silicon-based devices are considered. Thus, there is a three layer system having two interfaces. The fraction of light penetrating the semiconductor is affected by the reflection at these interfaces and by the corresponding interferences and depends on layer thickness, the material and the wavelength. In the most advantageous case (constructive interference for the transmission) nearly all light may be used, while in the most disadvantageous case (destructive interference) 30% . . . 50% are lost, depending on the wavelength, that is, exactly as much as is reflected at the air/semiconductor/air interface. Conventionally, the thickness and the material of the intermediate layer is selected such that constructive interference and thus a maximum anti-reflecting effect may occur, as is described for instance in DE-A 103 93 435.

However, the following limitations or disadvantages remain:

1. The layer thicknesses have to be provided with tight tolerances.
2. The anti-reflective behaviour is satisfactory for a specific wavelength only; there are other wavelengths that represent other orders of interference, which may provide for an efficient anti-reflecting behaviour, however, these wavelengths may not freely be selected.
3. In order to reduce the reflections for a wide wavelength range to a value of approximately 0, an anti-reflecting mechanism by simple λ quarter layers is not feasible. Materials with finely graded indices of refraction between one (air) and the maximum corresponding index of refraction of the semiconductor, such as silicon, would be required for the desired wavelength range. For example, the index of refraction of silicon is strongly dependent on the wavelength and is typically, however, above 3.5. Such materials for adapting the index of refraction are, however, not well-established in the conventional semiconductor technology and are thus not available at present.
4. The layers provided have to exhibit a very low absorption within the used wavelength range.

In typical applications for integrated photo diodes usually there are no broadband light sources used but preferably light emitting or laser diodes are used. These devices emit at a certain wavelength only and a conventional λ quarter anti-reflecting layer could be tuned to this wavelength. Frequently such integrated photo sensors of the same structure should be used for different applications, which may imply different light wavelengths. One example is the pickup system of modern CD/DVD composite drives. These devices have to function at three different wavelengths (blue, red, infrared) in an optimal manner without modification, wherein these wavelengths may not be represented by different orders of constructive interference. Even for an optimal adaptation of λ quarter layers a desired high transmission may not be obtained by the well-established materials silicon dioxide and silicon nitride, respectively. For silicon as semiconductor material and by using silicon dioxide as an intermediate layer at least a fraction of reflection of 8% remains. Using nitride the fraction is significantly less in the visible range, however for wavelengths below 400 nm the absorption becomes significant and also results in light losses.

The first inventive solution provides a photo electronic device having an optically active window for receiving and/or transmitting radiation. Furthermore, a nanostructure having statistically distributed structural elements is provided at a surface of the optically active window, wherein the structural elements have an end portion and a foot portion formed in the device and wherein the tip of the end portion has a lateral extension of less than 10 nm and the foot portion has a lateral extension of 50 nm or more. Furthermore, an aspect ratio of the structural elements (height of the structural elements with respect to their lateral extension at the foot portion) is greater than 4 on average.

The invention thus provides an anti-reflective surface for integrated optoelectronic circuits and also for discrete photoelectric devices with reduced effort and with low associated production costs, wherein additionally the disadvantages of items 1 to 4 are solved or at least significantly reduced.

The disclosed nanostructure having the "pin type" structures as the substantially "pyramid-like" structural elements, which comprise an "atomically sharp" portion and a lateral extension at the foot portion that becomes significantly broader, provides for a gradual adaptation of the index of refraction between the window material and the surrounding medium. Since in particular the lateral dimensions at the foot portion are less than the wavelength of the visible light the "material mixture" for the light may be considered as a "continuous" mixture, wherein, starting from the pure window material at the foot of the structural elements, the fraction of the surrounding medium, for instance air, increases with increasing height so that the index of refraction for the wavelength range of interest quasi-continuously decreases such that substantially no interface having a non-steady transition of the index of refraction exists for the light. The nanostructure may be produced by a method that is compatible with bipolar CMOS or BiCMOS technology for integrated or discrete devices, as will be described later on in more detail. The nanostructure may alternatively or additionally be applied to an anti-reflective coating. This is not associated with high efforts, however provides for an anti-reflecting behaviour of high quality independent on wavelengths for a wide wavelength range. In one embodiment the total relevant wavelength range for silicon photo diodes may be covered. A further advantage of the anti-reflecting characteristic by means of the above-specified nanostructure is the low dependence on the angle of incidence compared to λ quarter layers or periodic structures.

As will be explained later on in more detail, in applying the nanostructure in photo diodes or photo cells a characteristic is very advantageous that the nanostructure if formed from a semiconductor material, such as silicon, may provide for a high degree of "missing defects" of the used areas, that is, during the production of the structural elements by plasma etching substantially no additional crystal defects may be caused. Therefore the generated electron-hole-pairs may not encounter additional recombination centres and may still efficiently be drained off by the electrical field existing at the pn junction so that no significant reduction of the sensitivity is caused.

In a further advantageous embodiment the photo electronic device further comprises a passivation layer that exposes the optically active window and defines a boundary therewith; wherein the structural elements substantially extend to the boundary. In this manner, the effective area of the nanostructure may be locally precisely defined, wherein for example well-established masking regimes may be used. The formation of the structural elements also occurs substantially at the boundary region between the passivation layer and the nanostructure which is to be understood such that the structural elements extend at least to a distance with respect to the passivation layer which is half the value of the thickness of the passivation layer. Also at a pronounced step, which may be caused by the presence of the passivation layer, nevertheless high area coverage of the window by the structural elements is obtained and hence the high degree of the anti-reflective effect during receiving or transmission of radiation is maintained.

In one embodiment the structural elements are comprised of single crystalline semiconductor material. In this manner, the electrical function of the device may remain substantially unaffected by the nanostructure. As described above, the effects of the charge carrier accumulation may for instance be maintained, wherein the coupling in of radiation is significantly improved. Furthermore, the nanostructure may also be formed directly within the semiconductor material under consideration, wherein the composition and the doping may be set in advance. The nanostructure may be formed in an early phase of the manufacturing process, if required, wherein certain characteristics of the semiconductor material, such as doping, composition and the like may be adjusted afterwards. For this purpose, the nanostructure may be "conserved" in an appropriate material, for instance silicon dioxide, so that anneal processes, implantation processes the incorporation of different atomic species, such as germanium, into a silicon-based semiconductor and the like may be performed with a high degree of compatibility to conventional processes.

In one preferred embodiment the nanostructure comprises a single crystalline base layer on which the structural elements are provided, wherein a crystal defect density of the structural elements is substantially identical to the crystal defect density of the base layer. In this manner, the quality of the semiconductor base material may also be provided within the structural elements.

In one embodiment the semiconductor material is silicon. In this case an efficient self-organized etch process may be applied directly in a silicon-based device, as will be described later on in more detail. In other cases a silicon layer, such as a crystalline or polycrystalline or amorphous layer, may be applied and the nanostructure may then efficiently be formed therein by an etch process. This may also be accomplished in a polysilicon wafer.

In a further preferred embodiment the structural elements are at least partially comprised of an insulating material. In this manner an electrical passivation may be accomplished in cases in which an influence of the electrical behaviour of a device is not desired, or wherein a high degree of resistance with respect to a plurality of surrounding media is desired. For example, the insulating material may be silicon dioxide, silicon oxynitride or silicon nitride.

In a preferred embodiment a height of the structural elements is in the range of 400 nm to 1000 nm, and in particular up to 1500 nm. With these dimensions in the height direction in combination with the previously specified lateral dimensions excellent optical anti-reflecting characteristics may be obtained in the visible spectrum and also in the infrared range.

In a further preferred embodiment a photo electronic device further comprises a planarization layer in the optically active window, wherein the structural elements of the nanostructure are embedded in the planarization layer.

The planarization layer, which may also be referred to as a protection layer, fills the voids between the pin type structural elements to be protected, for example, the silicon tips, so that the structural elements are stabilized. For the further processing thus a closed layer is formed. Due to produced smooth surface mechanical stress may be compensated with a low risk of destroying the nanostructure. Due to this smooth surface a further layer may be applied and may also be removed with significantly less effort.

Depending on the material used this protection layer differently affects the function of the nanostructure. The surface increasing effect of a nanostructure is completely compensated for by a dense layer. A porous layer, however, may be used for allowing transfer of certain substances only at the surface of the nanostructure, which is important, for instance for chemical sensors. For all optical applications it is advantageous that the characteristic of the reflection and transmission or of the scattering is deteriorated only slightly or is even enhanced. For this purpose, the layer preferably has a low absorption. Losses due to reflection remain minimal if the index of refraction is close to the index of refraction of the surrounding medium, such as air. For example, in one embodiment the index of refraction of the material of the planarization layer is 1.5 or less.

In a further embodiment a second nanostructure is provided at a second surface of the optically active window. This is advantageous in applications in which the optical window is not directly formed in the base material of the device or in cases when recesses in the base material are to be covered by the window. For example, an appropriate window may be fabricated at a separate substrate and may subsequently be transferred to the device. Advantageously, the nanostructure and the second nanostructure are embedded in a protection layer.

According to a further aspect of the invention a sensor device is provided. The sensor device comprises a sensor surface formed by a nanostructure having statistically distributed structural elements wherein the structural elements have an end portion and a foot portion. The tip of the end portion has a lateral dimension of less than 10 nm and the foot portion has a lateral dimension of 50 nm and more. The aspect ratio of the structural elements (the height of the structural elements with respect to the lateral dimension at the foot portion) is higher than four on average.

By providing the nanostructure the area of the sensor surface is significantly increased so that a higher sensitivity may be achieved. Furthermore, for volatile media such as gases, the retention in the vicinity of the sensor surface is increased. Furthermore, if optical detection techniques are used, the sensor surface may at least partially be used as an optical window, wherein the previously described advantages may additionally contribute to the enhanced sensor behaviour.

According to one embodiment the nanostructure of the sensor device is formed from an insulating material, such as silicon dioxide and the like. In other embodiments the sensor device additionally comprises a porous planarization layer for embedding the nanostructure. In this manner a high mechanical stability and also protection with respect to environmental influences are achieved, wherein the porosity of the fill material nevertheless allows certain substances to contact the surface.

According to a further aspect of the invention an optical layer structure is provided for use in optical devices or optical apparatus. The optical layer structure comprises a base layer and a nanostructure including statistically distributed structural elements formed on the base layer. The structural elements comprise an end portion and a foot portion, wherein the tip of the end portion has a lateral dimension of less than 10 nm and wherein the foot portion has a lateral dimension of 50 nm and more, and wherein an aspect ratio of the structural elements, that is, a height of the structural elements to the lateral dimension at the foot portion, is higher than four on average.

The inventive layer structure may be used in a plurality of device and apparatus wherein the absorption behaviour and/or the emission behaviour may significantly be improved due to the previously described characteristics of the nanostructure formed in the layer structure. The optical layer structure may be produced separately, for instance on silicon surfaces, and may then be installed in the actual application by means of appropriate carrier materials.

In a further embodiment the optical layer structure comprises a conformal metal layer on the structural elements so that the absorption behaviour and/or the emission behaviour of the nanostructure may be adjusted independently from the base material of the structural elements of the nanostructure. In one embodiment the metal layer is used for a targeted heat dissipation. In this manner, by the improved emission of heat radiation and by the nanostructure and the metal layer for instance, the cooling effect for devices may significantly be enhanced thereby enabling reduced overall device volumes.

In a further aspect an optical device with a coating in the form of a broadband optical absorber is provided, wherein the coating comprises an optical layer structure as described before.

In a further aspect a digital projector with mirror technology (digital light processing) comprising an absorption phase is provided that comprises an optical layer structure as described above.

In a further aspect an apparatus is provided that comprises means for a wavelength independent conversion of optical radiation into heat, wherein the means for converting optical radiation in heat comprise an optical layer structure as described above.

In a further aspect an optical element for emitting optical radiation with an emission window is provided that comprises an optical layer structure as described above. In one embodiment the emission window is coupled to a light emitting diode for a laser.

According to a further aspect reflection reference means for determining low reflection values are provided, wherein the means comprise an optical layer structure as described above.

In the previously described aspects the diversity of the inventive nanostructure is advantageously used in various applications so as to improve performance of many optical devices.

According to a further aspect of the present invention a photo electronic device is provided that comprises a reflection inducing layer of statistically regularly distributed silicon pins with low crystal defects having a height of 400 to 1500 nm and an aspect ratio of 4:1 or higher within an optically active window.

Also in this case, the silicon pins or needles result in an enhanced performance with respect to the coupling in and/or coupling out of radiation of a wide wavelength range, wherein the reduced number of crystal defects do not significantly negatively influence the electronic behaviour. With a height of 400 nm an excellent anti-reflective behaviour may be obtained for visible light, wherein the efficiency may even be enhanced by increasing the height of the silicon pins.

Advantageously, the silicon pins have a tip with lateral dimensions of less than 10 nm. The tip of the silicon pins may thus be referred to as "atomically sharp". In combination with these small dimensions of the end portions of the silicon pins the foot portion of the silicon pins may have a lateral dimension of 50 nm or more, wherein on the one hand an advantageous "pyramid-like shape" of the pins may be generated and on the other hand the lateral dimensions at the foot of the pins may nevertheless remain below the wavelength of the visible light. The pyramid-like pins are not arranged too densely. The spacing is at least 50 nm in width. In this manner a quasi-continuous material distribution is generated for the wavelength range of interest so that a continuous change of the index of refraction along the height direction of the silicon pins is obtained. Thereby, for radiation in the visible range and for infrared radiation, which pass the nanostructure in the height direction, a steady change of the index of refraction occurs without encountering significant unsteady interfaces, which might otherwise lead to a high degree of reflection.

In one embodiment the photo electronic device comprises a passivation layer which exposes the active window and forms a boundary with the window, wherein the silicon pins are formed up to a distance to the boundary which is smaller than a value of half of the thickness of the passivation layer.

According to a further aspect of the invention an optical window is provided that comprises silicon and that has a broadband transparency in the infrared range, wherein both surfaces of the window comprise pin-type structural elements with nano dimensions with an aspect ratio of 4:1 and higher.

As is also described above in the context of the optical layer structure the optical characteristics of apparatus and devices may be enhanced, which require exchange of radiation on the basis of infrared radiation. In this case, the input face and also the output face of the window are provided with a nanostructure that provides at least at one and preferably at both sides for a quasi-continuous change of the index of refraction along the direction of propagation of the radiation and thus significantly reduces losses caused by reflection. The front side is preferred.

In a preferred embodiment the pin-type structural elements having the nano dimensions are protected with a SOG layer (spin on glass) with respect to mechanical influences. Hence, the optical window may efficiently be protected with respect to mechanical or other environmental influences during the final phase of its production process as well as during the further processing, for instance during the installation in an apparatus or a device. For example, the protecting material may comprise hydrogensilsesquioxane (HSQ), thereby resulting in an efficient process characteristic with advantageous optical characteristics, such as a reduced index of refraction and reduced absorption.

In a further preferred embodiment the pin-type structural elements having the nano dimensions are restricted to certain areas of the windows by conventional masking techniques so that in this manner non-processed mechanically stable and simple areas may remain, which may be sealed against air, liquids and vacuum. In this manner the optical window may be applied in many applications in a highly flexible manner.

According to a further aspect the invention relates to a method for adapting the index of refraction of an optically active window of a photo electrical device. The method comprises producing a nanostructure at a surface area of the window by means of a self-organized plasma etch process for etching a silicon-based layer, and adjusting an aspect ratio of structural elements of the nanostructure that are produced in the silicon-based layer to a value of 4 or higher, depending on the operational wavelength range of the photo electrical device.

By using a self-organized plasma etch process for producing nanostructures as are already described above, a high degree of compatibility is achieved with respect to manufacturing techniques of the semiconductor industry. In this case, the adjustment of the aspect ratio by appropriate means, as will be described later on, an adaptation of the optical characteristics to the requirements of the photo electronic device may be obtained in a highly efficient manner.

In one preferred embodiment the pin-type structural elements (in the above-indicated sense) are produced during the plasma etch process by using the working gases oxygen ($O_2$) and sulphur hexafluorine ($SF_6$) without using additional means for a specified mask formation in a single process step, wherein the silicon base layer is maintained at a constant temperature in the range of substantially 27° C., in particular in a range of ±5° C., during the process with a plasma power in the range of 100 to 300 W wherein increased plasma powers are used at higher process pressures and wherein the ratio of the working gas flow rates is adjusted in relation to the geometrical tool parameters such that the oxygen at the reaction point exhibits a self-masking effect at the silicon base layer, as may be obtained in a range of gas flow rates for $SF_6$ of 50 to 150 sccm and for O2 for 20 to 200 sccm, while the process time is only a few minutes.

With this embodiment pin-type structural elements in the nanostructure (in the above sense) having a high aspect ratio and with nano dimensions may be formed on silicon surfaces, wherein the effort for masking may be avoided or reduced and wherein an enhanced behaviour with respect to crystal stacking faults and chemical surface contaminations compared to conventional techniques as well as a high degree of compatibility with subsequent manufacturing processes are achieved. For this purpose, a reactive plasma atmosphere including two different gas components at most, that is, oxygen and a reactive SF6 gas for etching silicon is established by adjusting process parameters that provide for a self-masking effect for producing a nanostructure. The etch process progresses without any further working gases and is performed as a single step process, i.e. after establishing the plasma atmosphere the silicon surface is exposed to the etch plasma without performing any further process steps. In particular, no further measures are taken so as to obtain a dedicated micro masking of the silicon surface. Furthermore, the aspect ratio of the pin-type structural elements created in the plasma atmosphere is adjusted to a value of 4 or higher by controlling the process time.

In this manner according to the present invention a masking of the Si surface by photo resist or other substances, such as aluminium, gold, titanium, polymers, water or possible surface contamination and the like, may be avoided. The pin-type structural elements created by the inventive method have the appropriate shape for optical applications in the range of the visible light and also within the infrared range, wherein a shape of the pin-type structural elements is formed by the self-organized masking of the etch process, and comprises, in addition to an aspect ratio of greater than 4, also a "pyramid-like" portion wherein an extremely tapering of the pin tip is produced, while at the foot of the "pin-type structure" a moderately flatly terminating area is generated.

Generally, for the created nanostructure a very efficient anti-reflective behaviour can be observed in the visible range and also up to 3000 nm or more for an average length or height of the structural elements of approximately 400 nm. Without intending to restrict the present invention to the following explanation, investigations performed by the inventors indicate that the efficient self-organized masking (self-masking) is accomplished by the etch process itself and not by already existing or specifically added substances. Corresponding investigations on the basis of Auger electron spectroscopy (AES) and energy dispersion spectroscopy (EDX) indicate that the masking effect is obtained by SiO so that a high shielding effect is achieved by the locally formed silicon oxide. This results in an overall moderately low silicon consumption during the production of the pin-type structures and concurrently to a high aspect ratio so that the inventive method may advantageously and efficiently be used in the semiconductor production with a high degree of process compatibility.

Defects are not used for a specific mask formation. Instead of the specific masking prior to the etch process the previously described self-organized masking is used that is obtained by the special process conditions during the etch process. By the combination of the self-masking and the etching during the RIE process the production of self-organized pyramid structures with nanometer dimensions is accomplished by the plasma. Therefore it is possible to convert a smooth silicon surface in a regular, in the statistical sense, quasi-ordered pin structure with nanometer dimensions, i.e. with lateral dimensions in the range below the usual light wavelength, for instance the light wavelength of the visible light.

Furthermore, the inventive method provides for a significantly reduced number of contamination defects, which may for instance be caused by typical etch by-products, as well as crystal damage, which are typically encountered in conventional plasma assisted methods, or such defects may substantially be avoided within the measurement accuracy. For example, either with RHEED, CV, TEM or PDS measurements respective defects could be observed. Also a simple photo diode whose surface was processed according to this process did not exhibit any particular characteristics that could indicate an enhanced defect density. Hence, the nanostructure may be produced by a single plasma etch step with a quality that does not require any further material removal.

The structures produced by the method do not exhibit an etch shielding effect at high edges. Thus, it is possible to pattern areas of few micrometers, even when the area is laterally enclosed by a structure with a height of 5 µm.

The patterning of the silicon occurs on the basis of the plasma in the RIE process. These structural elements are significantly deepened during the etch process, thereby producing the structural elements with nanometer dimensions with a significant aspect ratio as a result of the etch process.

By using the working gas consisting of $SF_6$ and $O_2$ the pin-type structural elements are obtained with a low defect rate, that is, with a reduced crystal fault density and reduced surface contamination, independent from the crystallographic orientation of the silicon base surface, thereby providing a high degree of flexibility for implementing the inventive method in corresponding manufacturing processes for silicon-containing devices.

In further embodiments a combination or working gases with $O_2$ as a component is used. For instance, carbon fluorine ($C_nF_m$ with n equal to for instance 1, 2 or 4 and with m equal to for instance 2, 4 or 8) in combination with oxygen as the second gas component may be used. $SF_6$ or the other previously mentioned reactive gases are the second one of the two gas components in addition to oxygen and represent the actual etch gas in this case, whereas $O_2$ increases the etch rate and the self-masking effect (passivation). Also a high selectivity with respect to $SiO_2$ during the etch process may be obtained so that an efficient restriction of the silicon surface to be patterned is possible by means of a corresponding masking layer.

The temperature of the silicon base layer and the ratio of the working gases at the point of reaction at the Si surface are appropriately adjusted. Hence, an efficient adjustment of further process parameters, such as the specified flow rates, may be accomplished since the temperature that typically represents a "sensitive" parameters is predetermined in a very precise manner.

Also the process pressure and the plasma power are adjusted to each other in order to obtain the desired aspect ratio and concurrently the reduced contamination rate and a low crystal error density.

In particular while maintaining the oxygen component in the specified manner the ratio of the working gases is adjusted such that the removal rate and the self-masking effect may be balanced. In this manner, the patterning in the described sense as well as an "absence of defects" may be achieved.

According to the inventive method the absolute parameter values may efficiently be adapted to the portion of the exposed silicon surface. When the Si surface is covered to a high percentage by a mask layer, for instance an oxide or silicon nitride, this effect may be compensated for by increasing the reactive gas component, for instance the fraction of $SF_6$, in particular upon increasing the fraction of $SF_6$ concurrently the contents of oxygen may be reduced and the process pressure may be increased.

Based on the previously described process it is possible to produce structures having nanometer dimensions with a high and adjustable aspect ratio by means of a simple RIE tool having a parallel plate reactor. This is possible for large areas with a dedicated adjustment of process parameters as well as in smallest areas so that individual devices, such as sensor areas, optically active areas of optoelectronic devices and the like may be provided with a corresponding nanostructure in a dedicated manner without negatively influencing other device areas. Areas not to be patterned may simply be protected, for instance by an oxide mask. Furthermore, due to the low contamination rate and the low crystal error density an immediate further processing after producing the nanostructures may be accomplished without requiring sophisticated preparation and/or post process techniques.

In a further embodiment a protection layer for the nanostructure is formed so as to have a substantially planar surface. For this purpose appropriate deposition techniques may be used which may per se provide for a non-conformal material deposition, such as the spinning-on of materials having a low viscosity. Other techniques include the application of an appropriate material by means of an appropriate deposition technique with a subsequent planarization by removing excess materials by CMP (chemical mechanical polishing).

In a further embodiment a spin-on glass (SOG) material may be applied in several steps so as to have characteristics that are adapted to the requirements of the nanostructure to be passivated with an anneal process after each application step, until the planar surface is obtained. Hence, efficient non-conformal deposition techniques for applying material with low viscosity may be applied, wherein the subsequent curing may be performed layer by layer so that the desired final thickness of the cured material may be adjusted in a precise manner. For example, SOG layers of hydrogensilsesquioxane (HSQ) may be applied.

In a further embodiment an additional layer is formed prior to the plasma etch process, which provides, as a buffer layer, a different etch behaviour with respect to the silicon base layer for the same process parameters in that a self-organized structure is formed with only a moderately low aspect ratio, wherein the structure is reduced during the process.

In this manner, it is contributed to a reduction of the silicon consumption during the production of self-organized nanostructures in the region of a window opening of integrated circuits having optoelectronic components and of discrete electronic devices. In particular during the start of the etch process the creation of the structure advances slowly, while nevertheless silicon may be removed during this time period. Thereafter, the creation of the pins having the corresponding high aspect ratio advances faster. The material loss during the initial etch phase may have a disadvantageous effect if for instance doped regions are considered, in which the doping decreases according to a gradient starting from the surface. In view of a negligibly low influence on the device specifications this material removal is to be maintained as low as possible. By providing the buffer layer thus a corresponding material removal of the silicon may be avoided, while nevertheless a certain masking nanostructure is formed in the buffer layer which increasingly results in a locally different etch behaviour—while maintaining a desired non-uniformity—wherein the undesired initial material consumption in silicon remains low.

For example, the etch removal of a doped surface layer of the region within the window of an optically active component is reduced and also the aspect ratio may readily be varied. By applying an additional layer of defined thickness having a different etch behaviour compared to the silicon the losses caused by etch removal may be reduced. Since the production of the structure during the etch step is based on the plasma and thus a physical component of the etch step is responsible for the structure generation, this component is also effective in other materials, such as $SiO_2$. Since the structures produced by the plasma in $SiO_2$ have only a low height also nanostructures with high aspect ratios may not be generated therein. A self-masking effect by another chemical component does not exist. Hence, the oxide layer may substantially uniformly be removed, however it comprises a plasma generated nanostructure with a small height at the surface. The etch rate for $SiO_2$ is significantly lower during the above-specified RIE etch process compared to silicon. Immediately prior to completely removing the $SiO_2$ layer, this nanostructure that has become punctured and the different etch rate lead to a fast and immediate generation of high aspect ratios in silicon. The oxide layer may be removed first at locations of smallest thickness and hence the etch process advances with a significantly increased etch rate and thus forms a hole in the silicon.

If required, the entire oxide layer may be removed after a certain time interval wherein, however, a nanostructure with significant aspect ratios has been produced in the silicon, wherein the tips of the nanostructures are positioned approximately at the level of the previous $SiO_2$/Si interface.

The process time of the etch step and the thickness and the type of buffer layer may be adjusted to each other in an optimal manner. The etch step may last until the buffer layer is completely removed, however not longer since otherwise more material than required would be removed.

By means of the type of buffer layer material and the thickness of the buffer layer the self-organized nanostructure may be adjusted in aspect ratio and distance in height level with respect to the initial surface, since the generation of the structure by means of the plasma is dependent on the material used, and depending on the etch rate the buffer layer may act as an additional etch mask for a more or less extended process time.

In a further preferred embodiment the aspect ratio of the structural elements of the nanostructure may be adjusted via the thickness of the buffer layer. In this manner, the optical characteristics of the nanostructure may be adjusted in a highly efficient manner by a precisely adjustable process parameter, i.e. the layer thickness of the buffer layer, so that a high degree of flexibility may be obtained with respect to the selection of the etch parameter.

In a further preferred embodiment the buffer layer is an $SiO_2$ layer, which in one embodiment has a thickness of 20 nm to 100 nm. In other embodiments other materials may be used which may provide for a delay of the material removal in the actual silicon base layer. For example, if a high degree of compatibility is desired for the buffer layer and the silicon base layer an additional silicon layer may be formed on the base layer and may act as a buffer layer. Also other materials, such as silicon nitride, may be used.

In a further preferred embodiment the buffer layer is not completely removed so that the resulting structural elements have material of the buffer layer at their tip portions, thereby resulting in an enhanced strength of the structural elements. In other cases the buffer layer is substantially completely removed such that structural elements made of silicon are obtained whose height substantially corresponds to the initial height of the silicon base layer.

According to a further aspect of the invention a method is provided for protecting a layer having pin-type structural elements with a high aspect ratio which layer is a component of a chemical sensor, wherein gas permeable porous spin-on glass that is adapted in its characteristics to the requirements of the layer to be passivated, is applied in several steps, wherein an anneal step is performed after each application step until a smooth surface is formed.

In this manner, the nanostructure may efficiently be used in sensor applications since on the one hand a high protective effect may be achieved while on the other hand contact with gases is still possible.

In a preferred embodiment a non-porous layer is provided in the last step as a coverage, which layer is again removed at the last masking process.

In this manner an efficient protection is obtained during the finishing of the nanostructure, thereby ensuring a high degree of flexibility of the manufacturing process, wherein the non-porous cover layer may be removed with low effort prior to the last masking and thus patterning.

In a further embodiment the spin-on glass is liquid permeable so that a wide variety of applications is obtained for the sensor element.

According to a further aspect of the invention a method for passivating the surface of a semiconductor device is provided, wherein the surface comprises silicon. The method comprises the local exposure of an area of the surface, the production of pin-type structures having a high aspect ratio with nanometer dimensions and with lateral dimensions in the range below the light wavelength of visible light by means of a reactive ion etch process, and the modification of the area provided with the primary pin-type structures in order to generate secondary also pin-type structures.

By modifying the pin-type structures after their production on the basis of silicon efficient self-organized plasma assisted etch techniques, as described above, may be used, wherein then the desired material characteristics of the pin-type structures may be adjusted by the modification process. In this manner, by means of a single etch recipe a plurality of different nanostructure may be produced. In a further variant the pin-type structures may be provided with an insulating surface.

In one embodiment a silicon layer is deposited so as to provide the surface. In this manner, an arbitrary carrier material may be used, substantially without affecting the actual process for the patterning process wherein the desired material characteristics may further be adapted by the modification.

In one embodiment the modification of the area provided with the primary pin-type structures comprises a thermal oxidation.

In a further embodiment the modification of the area comprises the nitration of the area. In other cases dopants and/or other semiconductor species may be applied, such as germanium and the like.

In one embodiment the silicon in the primary pin-type structures is substantially completely converted into silicon dioxide.

In a further embodiment the primary pin-type structures are produced by reactive ion etching (RIE) by using the working gases oxygen and $SF_6$ in a single process step without using additional means for a specified mask formation during the patterning process merely by adjusting the process parameters such that the oxygen exhibits a self-masking effect at the silicon-containing surface at the reaction point, thereby initiating a self-organization of the pin-type structures. Hence, the primary structures may be formed by a highly efficient etch process, wherein the structures may then be subjected to the desired modification without great effort due to the reduced degree of defectivity and the low surface contamination.

BRIEF DESCRIPTION OF THE DRAWINGS

In the following further embodiments will be described with reference to the drawings, in which:

FIG. 1a is an electron microscopy illustration of an RIE etched silicon surface in cross-sectional view in an area that is partially covered by an oxide layer, FIG. 1b is an electron microscopy representation with obliquely incident electron beam, from which the homogeneity of the distribution of the silicon pins and the depth of the spacing between the pins is evident, FIG. 1c is an electron microscopy illustration in transmission mode with high resolution of a tip of a silicon pin, FIG. 1d is oriented perpendicularly, FIG. 2a is a conventional photo diode anti-reflecting mechanism in schematic cross-sectional view, FIG. 2b is an inventive anti-reflecting photo diode in cross-sectional illustration, FIG. 3a is a vertical section of the photo diode without a protection layer on the nanostructure according to a schematic illustration FIG. 3b is a vertical section of a photo diode having a protection layer on the nanostructure according to a schematic illustration FIG. 4a is a sequence of steps of the RIE etch process of the Si surface without a buffer layer with increased silicon consumption, FIG. 4b is a sequence of steps of the RIE etch process of the Si surface including a buffer layer with minimal Si consumption.

DETAILED DESCRIPTION

Figure 2C:
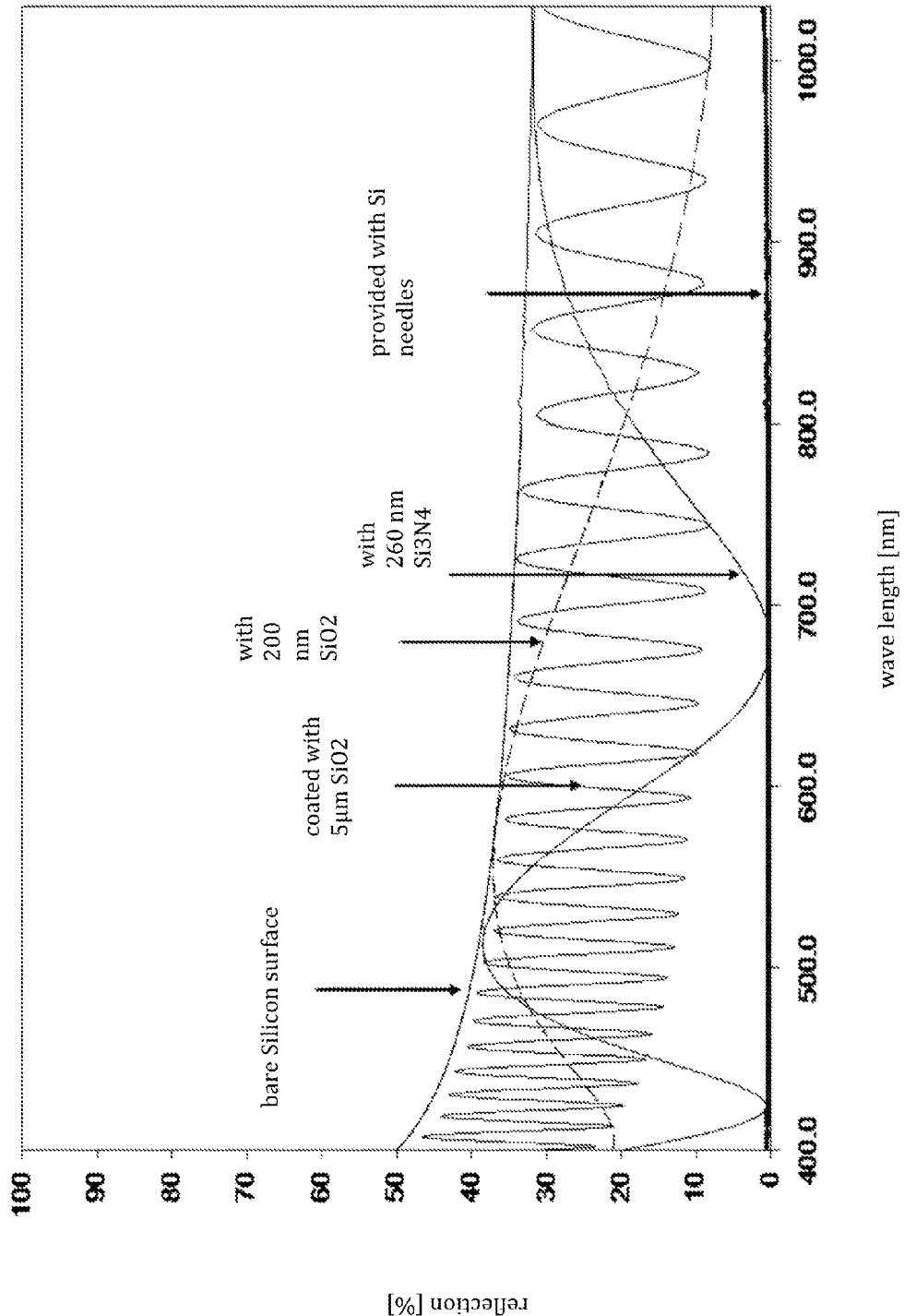
FIG. 2c is a diagram of the reflections of silicon surfaces that are made anti-reflective in different manners.

With reference to FIG. 1a to 1c first an exemplary nanostructure and an illustrative process for forming the same will be described. Similar processes and nanostructures may also be applied in other applications, such as photo electric devices, sensor devices in the form of optical layer structures in optical apparatus, as optical windows and the like, as is already described above and as will be described in the subsequent embodiments. Furthermore, the nanostructures, as are for instance produced by the subsequently described method, may be subjected to further treatments for applying protective layers, modifying the surface and the like.

FIG. 1a illustrates a silicon-containing device 1 comprising a nanostructure 2 that includes a single crystalline silicon base layer 3, on which pin-type silicon structures or elements 4 are formed, which are alternatively (but synonymously) also referred to as structural elements of the nanostructure 2. In this application pin-type silicon structures are to be understood as "pyramid-like pins or needles" or structural elements that have a tip with a lateral dimension of a few nanometers, wherein the tip significantly increases in its lateral dimensions towards the bottom so that in the lower portion of the structures a lateral dimension of some tenths of nanometers or more is achieved, while moderately smoothly terminating (with respect to slope of the many sidewalls of the metal portion).

The silicon base layer 3 in this embodiment is restricted by a mask layer 5, which may be comprised of silicon dioxide, silicon nitride and the like, wherein the pin-type silicon structures 4 are formed so as to extend to a peripheral portion 5a of the mask layer 5 with a small distance with respect to the peripheral portion 5a. Here, a small distance is to be understood as a distance that corresponds to less than half of the thickness of the mask layer 5. In the embodiment shown the silicon base layer 3 is a part of a silicon wafer with a diameter of 6" having a (100) surface orientation with a p-doping with a specific resistivity of 10 ohm·cm.

As explained above, the base layer 3 may have any other crystallographic orientation with an arbitrary pre-doping. In alternative examples the base layer 3 may be formed from a substantially amorphous or polycrystalline silicon.

FIG. 1b illustrates an enlarged section of the nanostructure 2, wherein the angle of incidence of the probing electron beam has a slope angle of approximately 17 degrees so as to more clearly demonstrate the scaling in the lateral direction and in the height or thickness of the pyramid-like structures or structural elements 4. As is evident from FIGS. 1a and 1b the silicon elements 4 have a height, approximately 1000 nm on average, so that in some embodiments a height is achieved that is greater than the wavelength of visible light. In other embodiments the height of the structural elements is 400 nm to 1000 nm and in particular cases even 1500 nm.

Due to the tilted electron beam of 17 degrees the illustrated height in FIG. 2 of 603 nm is to be recalculated into the real height. Also, the height extension may be recalculated up to 60 percent for lower pyramid-like pins, which may are effective at or above approximately 400 nm. This may be accomplished by contracting FIG. 2 in the height direction by 40 percent of the illustrated height.

However, pyramid-like structural elements 4 having a mean height in the range of 400 nm have excellent optical characteristics in a plurality of applications. For instance, for a mean height of 400 nm an excellent anti-reflecting behaviour could be observed in the visible wavelength range up to 3000 nm according to recent measurements.

As is evident from FIG. 1a a mean maximum height of the silicon structures 4 may also be substantially at approximately 1000 nm or more.

On the other hand, FIGS. 1a and 1b illustrate that the lateral dimension of the silicon structures 4 in a foot portion 4b is typically less than 200 nm or is below 100 nm so that on average an aspect ratio of height to lateral dimension is 4 or even higher.

The results shown in FIGS. 1a and 1b referring to a 6" (100) Si wafer having a p-doping, a resistivity of 10 ohm cm and an area fraction of the oxide mask, that is, the mask layer 5, of 90 percent or higher (up to 93 percent) were obtained in a single step plasma etch process in a plasma tool of the type STS320 with the following parameters:

| | |
|---|---|
| Flow rate $SF_6$: | 100 sccm |
| Gas flow rate $O_s$: | 20 sccm |
| Gas pressure: | 70 m Torr |
| Temperature of the silicon wafer: | 27° C. |
| Plasma power: | 100 W |
| Etch time: | 2 minutes |

Self-adjusting bias (that is, direct voltage potential between the plasma atmosphere and the surface to be etched): varies at approximately 350V (self-adjusting).

The 6" (inch) wafer rested in the tool RIE STS 320 on an 8" wafer, and the plasma is effective also adjacent to the 8" wafer.

Indicating a power density is possible only in a first approximation in an estimative manner. The plasma power may be adjusted within a range of 100 W to 300 W, which may correspond for a 6" wafer to a power density of approximately 4 W/cm$^2$ to 12 W/cm$^2$.

In a further embodiment gas flow rates of 50 to 150 sccm for the reactive gas, that is, $SF_6$, $C_nF_m$ or $HCl/BCl_3$ have been provided. For oxygen gas flow rates of 20 to 200 sccm have been provided. Furthermore, in some embodiments the temperature of the substrate and thus of the base layer 3 is adjusted to 27° C.±5° C.

In alternative examples comparable results have been obtained for the nanostructured surface. Initial parameter and process parameters are provided below.

For an area fraction of 0.1 percent silicon and 99.9 percent oxide mask the following parameters were used:

150 sccm $SF_6$
20 sccm $O_2$
91 m Torr
27° C.
100 W
Bias 28V
Etch time (process time) 4 minutes For 100 percent silicon surface, that is, a bare silicon wafer:
65 sccm $SF_6$
23 sccm $O_2$
50 m Torr
27° C.
100 W
Etch time (process time) 10 to 20 minutes For bare silicon wafers 20 minutes process time is sensible, too. In this case, an extremely high quality anti-reflecting effect is obtained with the process with respect to the surface nanostructured by the pins.

From the above information corresponding parameter values may also be determined for other etch tools and other fractions of coverage of the silicon base layer 3 to be patterned with the pyramid-like structures. For example, a lower degree of coverage of the silicon base layer may be taken into consideration by a lower gas flow rate of the reactive gas.

In further examples which are not explicitly illustrated here, the absolute parameter values may efficiently be adapted to the fraction of the open (or exposed) silicon surface. When the Si surface is covered to a high percentage by a mask layer, for instance oxide or silicon nitride, this may be balanced at least by increasing the fraction of the reactive gas component, for instance of the $SF_6$ fraction, in particular by increasing the fraction of $SF_6$ while concurrently decreasing the fraction of oxygen and also increasing the process pressure.

If no mask is present, the fraction of reactive gas components is low and vice versa.

Based on the above settings Si pins or structural elements having a height of up to 1000 nm in statistical distribution were generally obtained at areas not covered by the mask layer 5.

Silicon oxide or silicon nitride are appropriate for the mask layer 5.

Processed wafers having identical structures (without oxide mask) become completely black and exhibit a reflection of below 0.4 percent for the wavelength range of 400 to 1000 nm with excellent uniformity of this characteristic across the entire wafer. In particular, also in a wavelength range extending in both directions beyond the above-specified range of wavelengths between 180 nm and up to 3000 nm investigations confirmed a still very excellent anti-reflecting behaviour with reflections below 2 percent. The reflections comprise (practically exclusively) the reflections into all solid angles.

Furthermore, the crystal damage caused by the plasma assisted single step patterning process, as well as the contamination, are very low and below the detection limit in the illustrated embodiments. No residual substances could be detected after the plasma patterning process and the crystal quality of the silicon structure is nearly identical to the crystal quality of the silicon base layer prior to the etch process.

FIG. 1c illustrates a single tip 4a or an end portion of a structural element 4. As is clearly evident, the pins are nearly atomically sharp at their end portions 4a, that is, the lateral dimensions of the end portions 4a are a few nanometers and are thus smaller than 2 nm. In the illustration of FIG. 1c the crystal orientation is furthermore perpendicular to the surface of the silicon base layer 3. This direction corresponds to a <100> direction since in the embodiment shown the surface orientation is a (100) orientation. As is evident, the end portion extends substantially along the <100> direction with only a small deviation of less than 10 degrees so that the structural elements are substantially perpendicular except for a few degrees deviation with respect to the surface of the base layer 3. Furthermore, the individual atomic layers of the single crystalline pin are clearly recognizable, wherein any crystal errors caused by the etch process are not detectable. In the configuration of the base layer as shown the appearing atomic planes correspond to (111) planes.

Due to a strongly patterned surface of the base layer 3 after the process the surface thereof is significantly increased, thereby strongly changing the characteristics. The increased surface area offers a significantly increased area of attack for adhering molecules and hence the sensitivity of sensors may significantly be increased. For instance it has been recognized that gases may remain localized within the nanostructure 2 for a prolonged time interval.

In the optical field the pyramid-like structures 4 are of interest in that their lateral size is less than the wavelength of light (VIS/NIR), and due to the pin-type shape, i.e. the small lateral dimensions at the end portion 4a, and the moderately great dimension at the foot 4b of the pyramid-like structure due to the high aspect ratios a nearly perfect gradient layer is obtained. The index of refraction gradually changes from the index of refraction of silicon to the index of refraction of the medium surrounding the nanostructure 2, such as air.

The nanostructure 2 thus allows an adaptation of impedance or an adaptation of the index of refraction, thereby resulting in an excellent broadband suppression of reflections. Furthermore, it is well known that a strong curvature, as is the case for the pin tips 4a, is particularly suited for field emissions.

Thus, a wide field of applications is obtained for the nanostructure 4 in many micro devices and also in other fields, such as solar cells, sensors and the like, as is already described and as will be described later on.

The examples thus provide methods and structures in which silicon structures with a high and adjustable aspect ratio are provided, wherein due to the "specific" parameter settings in the self-masking plasma etch process in a single etch step a contamination and the creation of plasma induced crystal faults may be maintained at a low level so that with low effort for the single step patterning process the resulting structure may directly be used without requiring further post-process treatments, when pin-type silicon structures with high single crystalline quality are required.

Furthermore, no sophisticated surface preparations or additional measures for generating a micro masking are required. A preconditioning, that is, a preparation of the surface for obtaining the nanostructure, may be omitted.

By means of the RIE standard etch process for silicon a plurality of nearly crystal defect-free pin-like structures with high aspect ratio and with nano dimensions is generated at the surface of a silicon wafer or at any other silicon base layer without any additional patterning measures (e beam, interference lithography and the like) by means of a self-organized process, thereby achieving, among others, a broadband anti-reflecting behaviour.

With reference to FIGS. 2a to 2f further applications for anti-reflective characteristics of photo electronic devices by self-organized nanostructures and corresponding devices will be described, wherein the previously described structures and for example also the above-described methods may be applied.

The anti-reflective character or the non-glare character of photo electronic devices, such as photo diodes, as a component of an integrated circuit or as a discrete device, is not obtained in a conventional manner by λ-quarter layers but by means of nanostructures produced by an RIE etch process, thereby providing significantly enhanced broadband characteristics.

Thus, examples are photo sensitive devices in integrated circuits and discrete devices, such as photo cells. The result obtained by conventional means and the issues associated therewith are already described. Methods for fabricating an anti-reflecting surface for integrated optoelectronic circuits are thus possible with low effort and thus low costs while being compatible to discrete and integrated device technologies and avoiding the above-described disadvantages.

The corresponding techniques are compatible to a bipolar, CMOS or bi-CMOS technology for integrated or discrete devices, among others. These techniques may alternatively or additionally be applied in combination with anti-reflecting coatings. It is not more complex than the anti-reflecting coating, however it has a wavelength independent anti-reflecting behaviour with high quality across the entire wavelength range of interest for silicon photo diodes. A further advantage of the anti-reflecting behaviour is the reduced dependency on the angle of incidence compared to λ quarter layers or periodic structures.

Of particular importance for photo diodes is the characteristic of the defect-free nature of the used areas for the disclosed method since the generated electron-hole-pairs would otherwise recombine and would not be drained off by the electrical field, which represents a significant reduction of sensitivity.

FIG. 2a schematically illustrates a conventional photo electric device 200 comprising a silicon substrate 201, an n-well 202 and respective contacts 205. Moreover, an optical window 203 is provided that is made anti-reflective by means of an anti-reflecting coating 204.

FIG. 2b schematically illustrates the photo electric device 200 according to one embodiment of the present invention. In this case, within the optical window 203 a nanostructure such as the structure 2 is provided so as to obtain a broadband anti-reflecting behaviour.

As described above the self-organized nanostructures, such as the structure 2, have a geometric shape that is appropriate for the application as an anti-reflecting layer. The lateral distances are less than the wavelength in the medium so that scattering losses do not occur. The nanostructures (FIGS. 1a to 1c) are sufficiently high by being greater than 500 nm (at approximately 1000 nm). At 400 nm a very good anti-reflecting behaviour can be observed, which may even be enhanced with increasing height.

The reduction of the reflections at such a surface may be explained by an adaptation of impedance, i.e. by an adaptation of the index of refraction between the two materials. The structures generate a gradual transition in impedance between the materials. This transition has to be sufficiently broad (here the height of the structures) so as to be appropriately effective. The gradual transition works according to the principle of the effective medium, wherein two substances are mixed with each other such that the medium may appear as a substance of mixed characteristics with respect to the initial materials for the application under consideration. Since the nanostructures have a pin-type shape in the above-defined sense a virtually continuous transition is obtained from one medium to the other (here from air to silicon). It is known from the field of electro techniques, cf. Pozar, Microwave Engineering (second edition), John Wiley and Sons, New York 1989, that at least at the end of the transition a certain non-linear shape is particularly effective.

The structure used herein exhibit such a shape. They are very sharp, however terminating in a flat manner, thereby resulting in an initially low but at the end very strong change of impedance.

FIG. 2c illustrates corresponding curves of reflection for different devices 200 with and without the nanostructure 2.

The measured reflection spectra confirm the drastic reduction of the reflection losses.

Figure 2D:
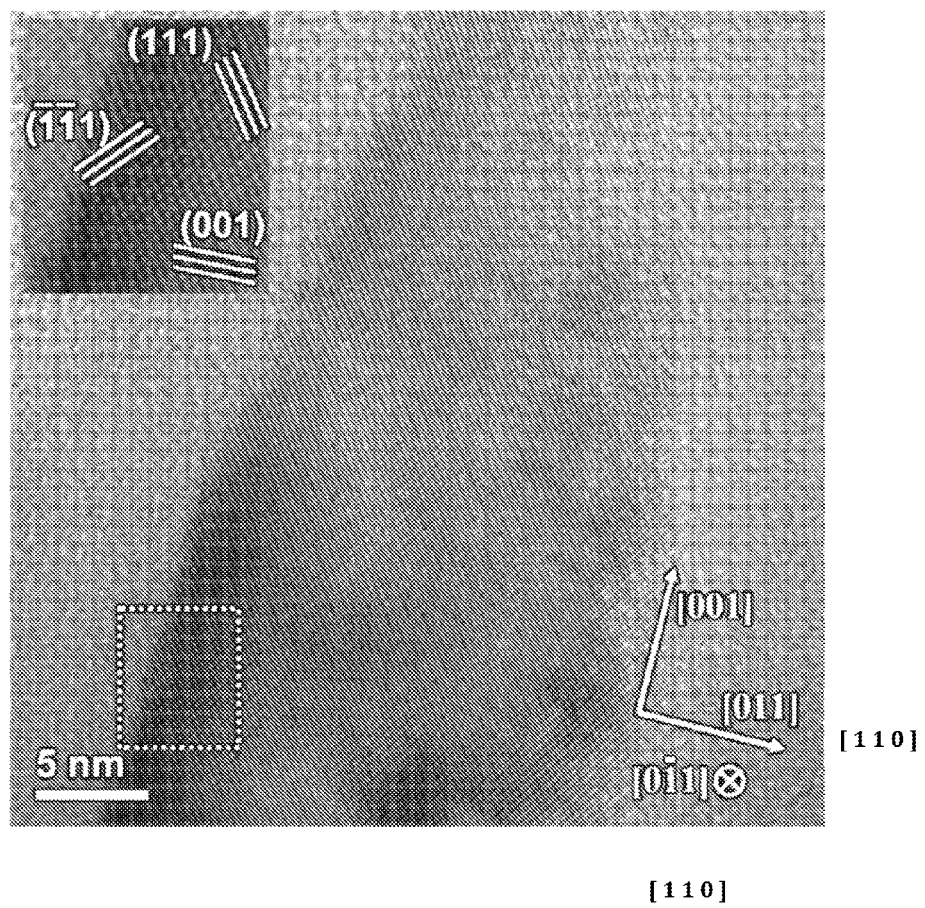
FIG. 2d is an electron microscopy illustration in transmission mode of a single silicon tip of the surface treated by RIE.

FIG. 2d illustrates the result of crystallographic measurements indicating that the nanostructure 2 remains in a single crystalline configuration during the fabrication. In FIG. 2d corresponding atomic planes are observable in the upper section of a structural element, as is also shown in FIG. 1c. No additional crystal errors with respect to the base layer 3 are detectable and the pin or needle is substantially oriented along the [100] direction. Thus, no additional generation and recombination centre are created. Consequently, the risk of undesired loss of photo current or enhanced quiet currents is sufficiently reduced.

Figure 2E:
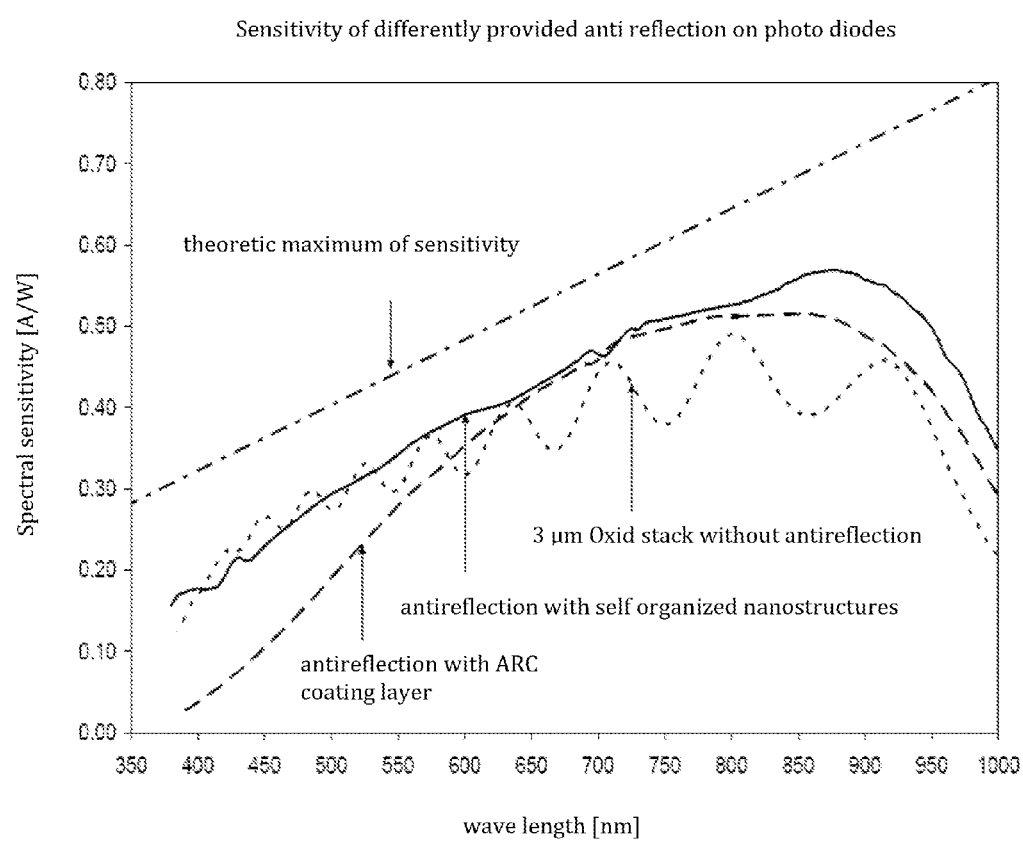
FIG. 2e is a diagram of the spectral sensitivity of equally configured diodes having different passivation layers.

FIG. 2e illustrates spectroscopic sensitivity measurements for such inventive anti-reflecting diodes, which confirm the enhanced sensitivity for an increased wavelength range. In particular the strong oscillations caused by interferences, which are usually encountered for a standard passivation of integrated photo diodes, are prevented.

One illustrative method relates to a method for making a silicon photo diode anti-reflective, wherein the method is characterized in that pin-type structures with nanometer dimensions having an aspect ratio of 4:1 and higher are formed in the surface area of a diode window without crystal errors by means of a reactive ion etch process (RIE) using working gases oxygen and $SF_6$ without additional means for a specific mask formation in a single process step, wherein a silicon wafer is maintained at a constant temperature in the range of 27° C.±5° C. during the process with a plasma power in the range of approximately 100 to 300 W, wherein higher plasma powers are required at higher process pressures and wherein the ratio of the working gas flow rates which is established in advance on the basis of the geometric tool parameters in an empiric manner, is adjusted such that the oxygen exhibits a self-masking effect on the silicon wafer at the point of reaction, which may be accomplished for a range of gas flow rates for $SF_6$ of 50 to 150 sccm and for $O_2$ of 20 to 200 sccm and with a process time of several minutes.

In a further embodiment the device, for instance the device 200, comprises a reflection reducing layer of statistically regularly distributed silicon pins with reduced defectivity with a height of 400 to 1500 nm and with an aspect ratio of 4:1 or higher as obtained by using the RIE method according to the previous method in the optically active window area.

Figure 3C:
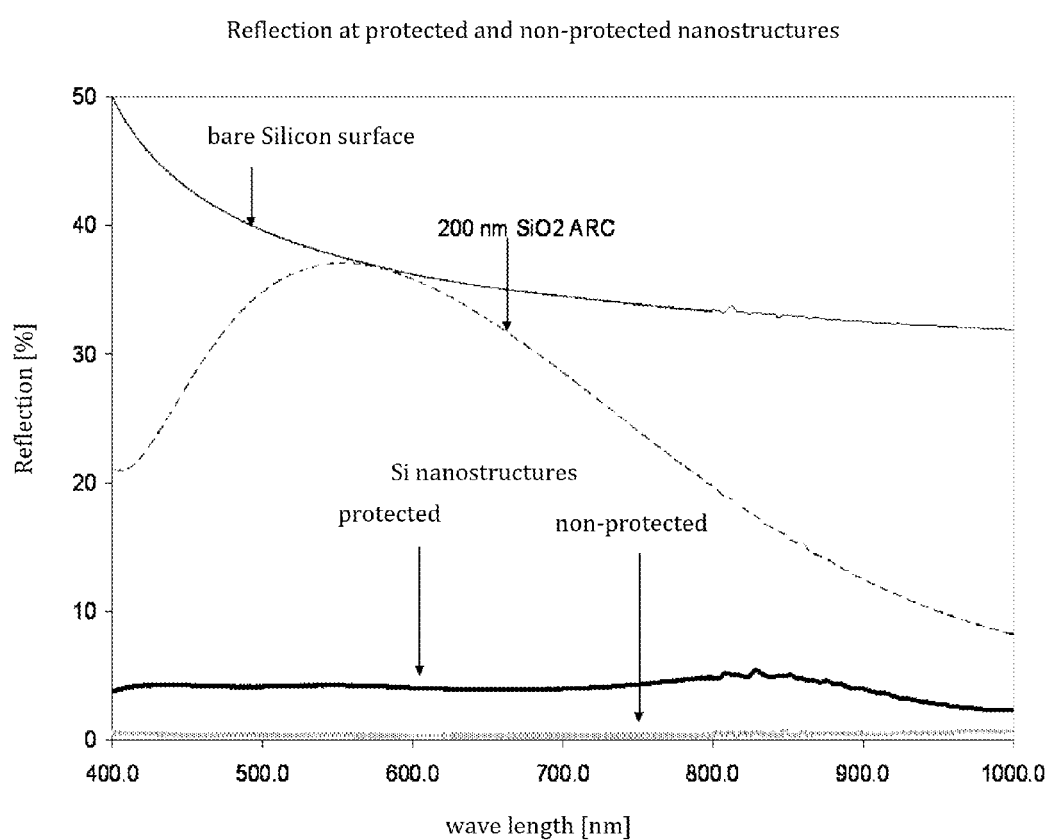
FIG. 3c is a diagram including values of reflection prior to and after the application of the SOG protection layer on a silicon nanostructure.

With reference to FIGS. 3a to 3c further embodiments of the invention will now be described, which provide methods for protecting sensitive nanostructures.

Extremely fine structures (nanostructures) are not very robust with respect to mechanical forces. Therefore, for a plurality of applications it is necessary to protect them with respect to mechanical damage. This protection is accomplished by a filling in substance to obtain a smooth surface. For this purpose, spin-on glass (SOG) with adapted characteristics may be used.

Protective layers for easily to be scratched surfaces are available for a long time, for example, hard layers for plastic glasses or CDs. Also with respect to nanostructures there have been made efforts for protecting the same, CFEP-A1215513.

Basically, a protection layer should prevent the destroying of functional elements, without unduly compromising the functional behaviour thereof. In this case, typically a plurality of constraints is to be taken into consideration, thereby making the realization of such a layer complex. This especially holds true for the protection of a layer consisting of pin-type silicon tips having nanometer dimensions with an aspect ratio of 4:1 and higher—briefly referred to as nanostructure—as may be formed by, for instance, the RIE method in a crystal defect-free and self-organized manner, as is already described.

The examples provide a method for protecting such nanostructures, wherein a mechanical protection during further manufacturing processes of silicon wafers including such layers may be accomplished without significantly changing the specific characteristics of these layers, such as reflection, adhesion of chemical substances and the like.

Hence, advantages are achieved such that the protection layer fills the voids between the pin-type silicon tips to be protected and thus the structures are stabilized. For the further processing a closed layer is formed.

Due to the smooth surface generated thereby mechanical stress may be accommodated without destroying the nanostructure. A further layer may be applied and may also be removed more easily from such a smooth surface.

Depending on the material used this protection layer may differently affect the functional behaviour of the nanostructure. The surface increasing effect of a nanostructure is completely prevented by a dense layer. On the other hand a porous layer may be used so as to alloy specific substances to pass and reach the surface of the nanostructure, which plays a role for instance for chemical sensors. For all optical applications it is important that the characteristics of the reflection and transmission or also of the scattering are only slightly compromised or these characteristics are even enhanced. For this purpose, the layer preferably comprises a low absorption. Losses of reflection remain minimal if the index of refraction is as low as possible.

FIG. 3a schematically illustrates a photo electric device 300 comprising a silicon substrate 301, an n-well 302 and respective contacts 305. Furthermore, an optical window 303 is provided, which is made anti-reflecting with a nanostructure 2 as described.

For example, for making the device anti-reflective, for instance a photo diode formed by a CMOS process, a nanostructure 2 is etched into the surface of the silicon by means of the RIE method, as described. Typically, further process steps may follow. Among others, the bond pads for the contact 304 of the device 300 are exposed by removing the passivating layer of the circuit. This layer typically consists of $SiO_2$ or $Si_3N_4$ and is frequently applied by a CVD method. This method is more or less a conformal process. Sharp structures therefore will be maintained. A smooth surface is not created. For removing the passivation layer a resist mask and an etch step are used. The applied resist material however may not be removed from the nanostructure 2 without problems; resist residues compromise its functionality.

FIG. 3b illustrates the device according to an illustrative embodiment.

For protecting the nanostructure 2 therefore the layer 305 made of spin-on glass (SOG) is formed in advance by spin-on techniques, for instance in the form of hydrogensilsesquioxane (HSQ). Since this substance is in a liquid state upon application the intermediate spaces of the nanostructure are filled in a void-free manner. An anneal step cures this glass and also results in a certain material contraction so that this procedure may advantageously be repeated. After a few such steps the nanostructure is completely enclosed and the surface is even and resistant against mechanical damage.

The nanostructure protected in such a manner may now be further processed according to standard processes of CMOS technology without problems. The application of a resist layer and a removal thereof is no longer a problem. Due to the low index of refraction of 1.38 and the low absorption in the wavelength range from 150 nm or 180 nm to 1100 nm the optical function of the nanostructure 2 is only slightly compromised.

FIG. 3c illustrates corresponding measurement results for the reflection of the optical window 303 for situations including an ARC (anti-reflecting coating) with bare silicon, without the structure 2 and for the devices 300 according to FIGS. 3a and 3b. A broadband anti-reflecting characteristic remains with a refraction of 3.5 percent that is significantly better than that of the smooth bare silicon interface with more than 30 percent.

One embodiment relates to a method for protecting a layer that consists of pin-type silicon tips having an aspect ratio of 4:1 and higher with nanometer dimensions, wherein a spin-on glass is applied in several steps and is adapted to the requirements of the layer to be passivated, wherein after each application step an anneal process is performed until a smooth surface is obtained.

In a further embodiment SOG layers comprised of hydrogensilsesquioxane (HSQ) are applied for layers of pin-type silicon tips that are present in windows of photo electric devices.

A further embodiment relates to a method for protecting a layer that consists of pin-type silicon tips having a high aspect ratio and that is a component of a chemical sensor, wherein gas permeable porous spin-on glass that is adapted to the requirements of the layer to be passivated is applied in several steps with an anneal step after each application step until a smooth surface is formed, and wherein in a last step non-porous layer is provided as coverage, which is removed again at the last masking process.

A further embodiment relates to a method for protecting a layer that consists of pin-type silicon tips having a high aspect ratio and which is a component of a chemical sensor, wherein liquid permeable porous spin-on glass is applied in several steps and is adapted to the requirements of a layer to be passivated, wherein after each application step an anneal step is performed until a smooth surface is formed, and wherein in a last step a non-porous layer is provided for coverage, which is again removed at the last masking process.

With reference to FIGS. 4a and 4b further embodiments will be described in which the material removal during the formation of a nanostructure having pin-type tips and a high aspect ratio is reduced so as to enhance manufacturing tolerances and yield.

The "pyramid-like nanometer structures" formed by the RIE process (reactive ion etching) previously described in a self-organized manner, as already described above, require a certain time period for the complete formation. Since the etch process is already effective at the start, a partially considerable material removal occurs. This effect may be reduced or may completely be suppressed by an adapted buffer layer.

In this manner the advantages are obtained that the etch removal of the doped surface layers of the area within the window of the optically active components or of sensor elements is reduced and moreover the aspect ratio may readily be varied.

FIG. 4a illustrates a typical process flow of individual intermediate steps for forming a previously described nanostructure 2 (cf. FIGS. 1a to 1c), wherein starting from a planar silicon surface 411a on a silicon body 401 with increasing etch time the nanostructure 2 is formed in a non-masked area 403 of the silicon surface 401a, wherein finally a material layer 405 of the initial silicon volume 401 is "consumed".

FIG. 4b schematically illustrates the production of the nanostructure 2 by means of a buffer layer 406 having a reduced etch rate compared to silicon 401. Hence, initially a significantly less pronounced structure 406a is created which is then driven into the silicon 401, wherein the consumption of silicon 401 is significantly reduced or is even avoided. Due to the etch characteristics and the thickness of the buffer layer 406 thus also the aspect ratio of the nanostructure 2 (as 403a) may be adjusted, as is described above. The residues of the buffer layer, illustrated as 406a, may be removed by taking advantage of the etch selectivity between the buffer layer and the silicon 401, or these residues may be maintained, as is shown.

Figure 5:
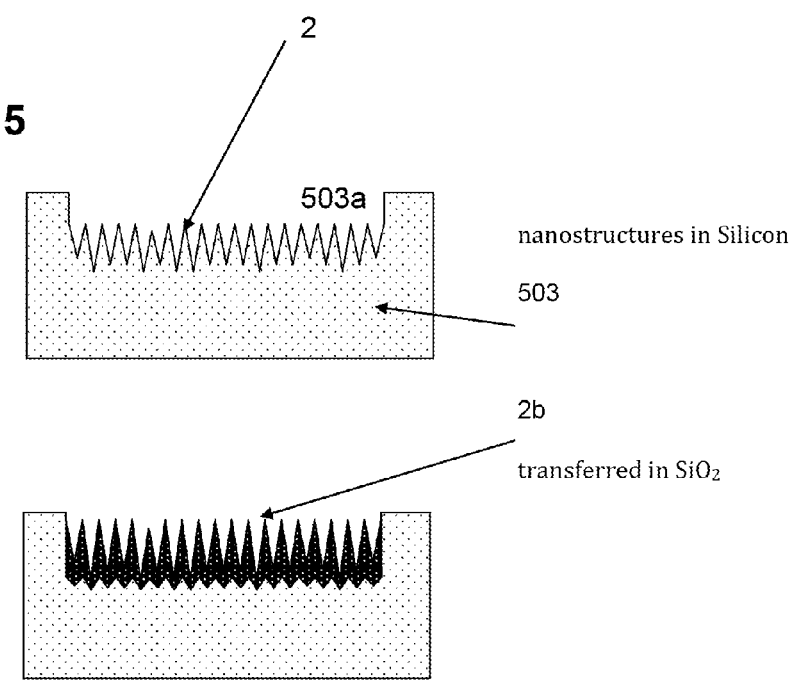
FIG. 5 is the process flow of a modification of a silicon nanostructure into an SiO2 structure according to an illustrative embodiment.

With reference to FIG. 5 further embodiments will be described in which a base nanostructure or a primary structure is modified to obtain the desired surface characteristics.

By exposing an existing silicon layer or by applying an additional silicon layer, by subsequent patterning of the layer by means of RIE processes inducing the self-organization of pin-type structures having dimensions in the nanometer range beyond the usual light wavelength having a high aspect ratio (nanostructures) without application of additional means for masking during the patterning processes in areas of interest and by modification, for instance thermal oxidation of these patterned layers an appropriate surface, for instance an $SiO_2$ layer is formed having substantially the same structure. This layer has a broadband anti-reflecting effect and may also contribute to an increase of sensitivity by increasing the adhesion area for atoms and molecules in sensor devices.

In a further embodiment the invention relates to the production of a passivation layer comprised of a desired material, such as $SiO_2$ on light sensitive or light emitting devices and on sensor devices. These devices may be discrete or may be monolithically integrated together with semiconductor circuits. The passivation layer consists, at a surface thereof, of structures having pin-type tips of a high aspect ratio and thus exhibits a broadband anti-reflecting effect for the usual wavelength range.

The method of the invention allows production of such a surface topography by using means adequate for semiconductor technology characterized by pin-type structures having high aspect ratios with nano dimensions, i.e. in the range below usual light wavelengths by using an appropriate surface material, such as a thermal $SiO_2$.

Hence, existing methods of the semiconductor technology may be used, additional interferences are not generated and a layer of a broadband anti-reflecting behaviour or increased adhesion area, respectively, is obtained.

By applying a modification by oxidation the oxygen diffuses in all directions into the silicon lattice at the high temperatures of the thermal oxidation due to the pin shape of the individual tips. This process occurs at any position on the large surface area. Therefore, the pin structures are particularly quickly oxidized. The method is simple to apply and offers the possibility of forming a secondary nanostructure consisting of $SiO_2$ with moderately low effort, which, when formed in a different manner, would require significantly higher efforts or would realizable only in a limited manner.

The $SiO_2$ layer grows in two directions. On the one side, the layer extends into the silicon and on the other hand the total structure grows due to the increase of volume of $SiO_2$. The silicon is completely converted into $SiO_2$ at least at the tip area. The surface topography of the silicon is transferred to the new $SiO_2$ layer with slight modification only, while the interface $Si/SiO_2$ is strongly planarized with respect to the initial Si surface.

In other embodiments other modification procedures are performed, for instance a nitration, in which nitrogen is incorporated into the silicon so as to change the surface characteristics. Also dopants or substances for surface modification or even for a material modification reaching partially deeply into the pins may be incorporated.

FIG. 5 illustrates a process sequence. In the upper portion of FIG. 5 a nanostructure 2, which may be reduced according to the previously described method, is formed in an area 503a of a silicon base layer 503.

In the lower portion of the Figure the nanostructure 2b is illustrated, after having been subjected to the modification process, which in this embodiment comprises a thermal oxidation, a plasma oxidation, a wet chemical oxidation and the like.

Due to the strongly varying surface topography the area thereof is significantly increased, thereby strongly changing the characteristics thereof. Gases may remain localized within the structure for a long time. The increased surface area thus offers a much greater area of attack for adhering molecules and thus the sensitivity of sensors may significantly be increased.

In the optical field the structures are of interest, since they are smaller in their lateral size compared to the light wavelength (VIS/NIR) and thus provide a virtually perfect gradient layer due to their shape and the high aspect ratios. Thus, these structures provide an impedance adaptation resulting in an excellent broadband suppression of reflections without scattering the light.

Since for most of the semiconductor devices a passivation layer is required and this layer may be realized by $SiO_2$ the invention is applicable also for optical devices. Application of a passivation layer is possible without causing the usual losses of reflection of 3.5 percent ($SiO_2$/air transition).

A further embodiment relates to a method for passivating the surface of semiconductor devices made of silicon by means of an $SiO_2$ layer comprising pin-type structures having a high aspect ratio with nano dimensions, i.e. in the range below the usual light wavelengths, characterized by locally exposing the surface of the silicon and subsequently generating primary pin-type silicon structures having nano dimensions by means of a reactive ion etch process, wherein this patterned silicon surface is subsequently transferred into a secondary also pin-type $SiO_2$ structure by thermal oxidation.

A further embodiment relates to a method for passivating the surface of semiconductor devices formed of silicon by means of an $SiO_2$ layer comprising pin-type structures having a high aspect ratio with nano dimensions, i.e. in the range below the usual light wavelength, characterized by depositing a silicon layer on the surface and subsequently producing primary pin-type structures in this silicon layer with nano dimensions on the basis of a reactive ion etch process, wherein this patterned silicon layer is subsequently completely or partially transferred into secondary also pin-type $SiO_2$ structures by a thermal oxidation.

In a further embodiment the required primary nanostructures in silicon are formed by reactive ion etching (RIE) by using the working gases oxygen and $SF_6$ in a single process step without application of additional means for a dedicated mask formation during the patterning process merely by adjusting the process parameters such that the oxygen exhibits a self-masking effect at the silicon wafer at the point of reaction and such that a self-organization of the pin-type structures occurs.

Figure 6A:
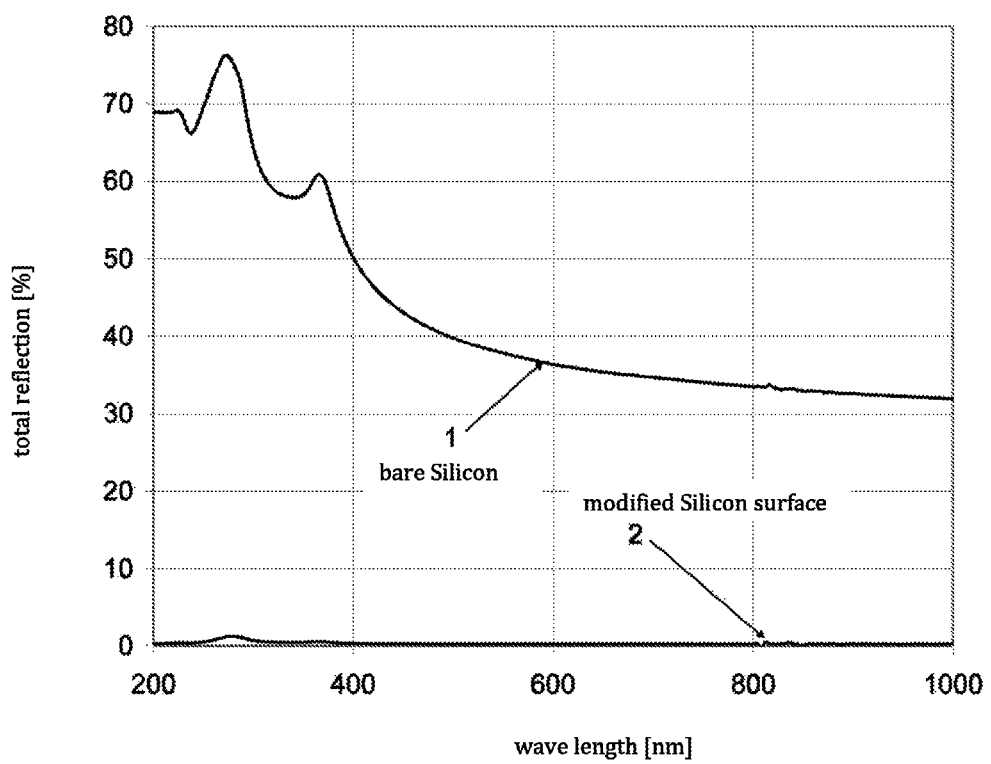
FIG. 6a represents measurement results of the optical reflection of modified silicon surfaces compared to non-treated surfaces wherein the measurement results are obtained by an Ulbricht ball and describe the reflections of the surfaces with respect to any spatial direction.
Figure 6B:
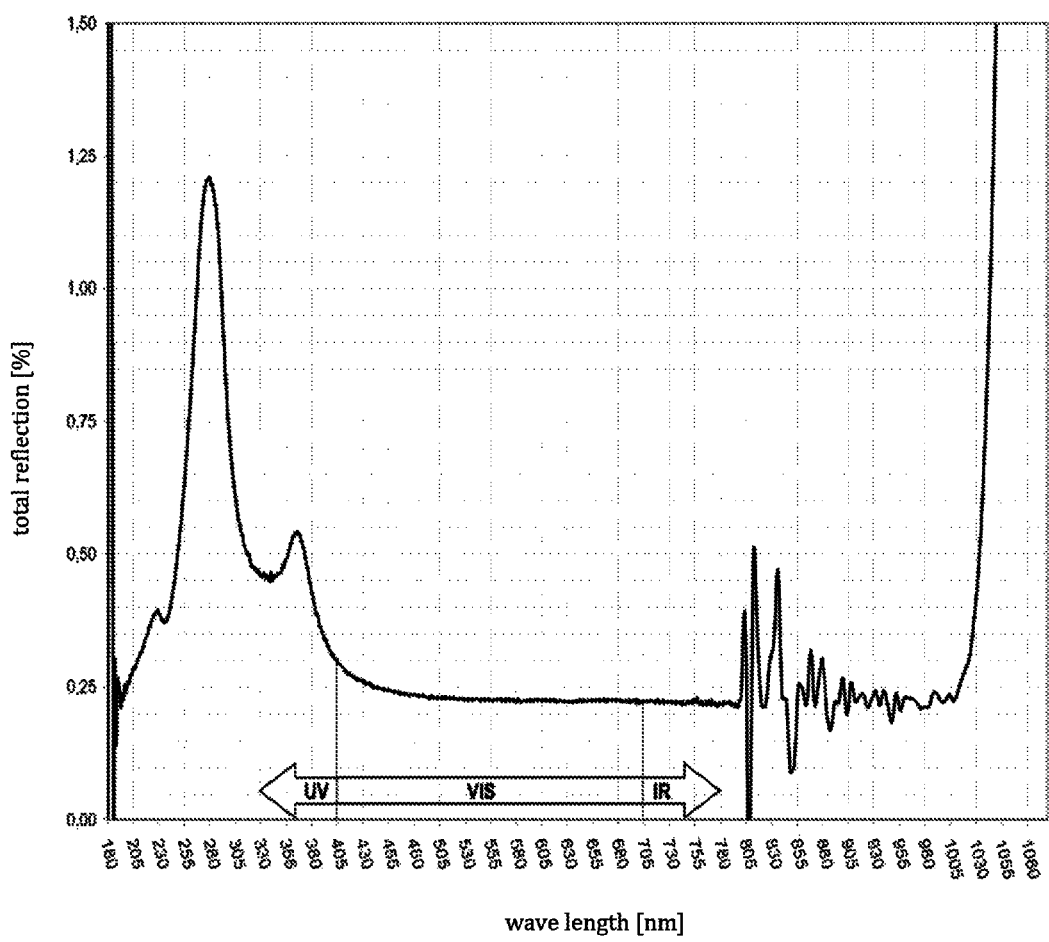
FIG. 6b illustrates the extremely low and wavelength independent reflection of the modified silicon surface in detail, wherein in the visible range very low and wavelength independent reflection values occur and wherein the noise above 800 nm is caused by a change of detector in the measurement apparatus.
Figure 6C:
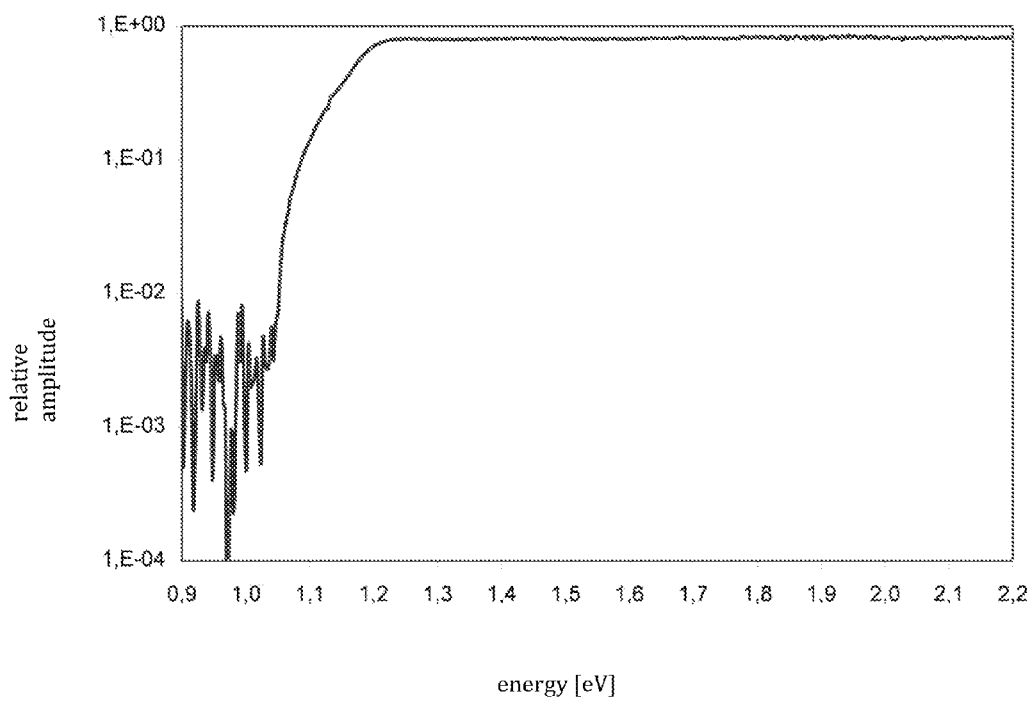
FIG. 6c illustrates the direct absorption measurement by photo thermal deflection spectroscopy (PDS) of a modified silicon surface, wherein an amplitude of "one" corresponds to 100 percent absorption (0.9 eV=1350 nm to 2.2 eV=560 nm)

With reference to FIGS. 6a to 6c further embodiments of the invention will now be described, in which nanostructures based on silicon are used as broadband optical absorbers.

Silicon surfaces comprising a self-organized nanostructure formed by an RIE method may excellently be used as absorbers, wherein nearly all light in the range of 180 to 1100 nanometers is absorbed. Furthermore, they are appropriate for the emission of radiation. By applying a thin additional layer the wavelength range of absorption and emission may significantly be increased.

This aspect relates to the application of patterned surfaces of silicon crystal bodies ensuring the highest possible light absorption for a large wavelength range. For this purpose the interface characteristics between two media are to be changed such that no impedance step occurs between them, that is, no discontinuity in the index of refraction occurs, but the different impedances blend continuously together.

Hence, advantages are obtained such that the pin-type silicon tips having the high aspect ratio with a statistically homogenous distribution at the surface represents an effective medium that provides for the steady transition of the two material characteristics. In this manner, an absorption of above 99 percent may be obtained within the entire visible range with the modification of a silicon surface. Such an efficient absorption may even be obtained beyond the visible range.

In FIG. 6a measurement results of the optical reflection of modified silicon surfaces is illustrated in comparison to non-treated surfaces.

FIG. 6b illustrates the extremely small and wavelength independent reflection of the modified silicon surface in detail.

FIG. 6c illustrates the direct absorption measurement by photo thermal deflection spectroscopy (PDS).

At a wavelength of 1100 nm silicon becomes transparent and no longer absorbs light. In order to act as an absorber even at a wavelength range above 1100 nm the patterned silicon surface may be coated, for instance with a thin metal layer. The metal takes over the function of the absorbing material, wherein the surface modification is obtained by the structure in the silicon.

The invention is not only effective in one direction, i.e. from material A to material B, but is also effective in the opposite direction, i.e. from material B to material A. In this manner the invention also provides for an improvement of the emission in the wavelength range of interest.

The particular advantage of the efficiently absorbing self-organized broadband nanostructure on the silicon surface may be taken advantage of in many applications. Such layers may preferably be used in optical apparatuses or components. An example may be the coating of optical precision devices or the absorption area in digital protectors having mirror technology (digital light processing) in which a substantially complete absorption of the incident light is important so a to obtain contrast values as high as possible. Furthermore, for a colour true representation it is necessary that the absorption characteristics are constant over a wide wavelength range. Other applications may relate to situations in which it has to be ensured that incident light is substantially completely converted into heat without depending on the wavelength. Due to the efficient broadband characteristics the invention may also be used as a reflection standard for very low reflection values. A further application is the enhanced emission of radiation as is encountered in optical devices, such as LEDs or laser. Due to the metal coating an emission of heat radiation is possible. This may be used for a dedicated heat dissipation or for an efficient cooling. An interesting application in this respect is the reduction of the cooling surface of devices by improving the heat dissipation.

One embodiment relates to self-organized pin-type structures of nano dimensions having dimensions less than light wavelengths and an aspect ratio of greater than 4:1 produced by the RIE method at silicon surfaces by using the working gases oxygen and $SF_6$ (without application of additional means for a dedicated mask formation) during the etch process in a single process step, as is already described, wherein these nanostructures are used as a form of layers as broadband optical absorbers for the coating of optical precision devices.

In a further embodiment the pin-type structures are used as absorption surfaces in digital projectors based on mirror technology (digital light processing).

In a further embodiment the pin-type structures are used for apparatuses in which the optical radiation is to be converted substantially completely into heat in a wavelength independent manner. In a further embodiment the pin-type structures are used for the purpose of improving emission of radiation, as is the case in optical devices, such as LEDs or LASER.

In a further embodiment the pin-type structures are used as reflection standards for very low reflection values.

In a further embodiment the pin-type structures are coated with a thin metal layer.

In a further embodiment the metal layer is intended for a dedicated heat dissipation.

Figure 7:
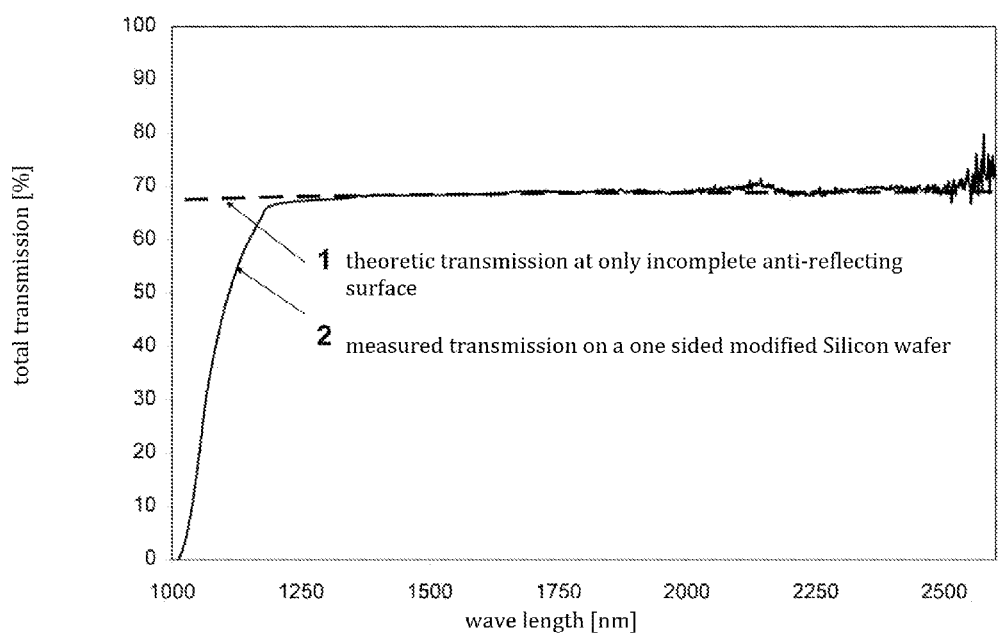
FIG. 7 illustrates the transparency of a sample having a single sided modified surface, wherein the theoretical curve neglects the absorption of silicon.

With reference to FIG. 7 further embodiments will be described, in which IR windows having a high transmission are provided.

The broadband anti-reflecting effect of silicon obtained by a self-organized nanostructure produced by the RIE method as described above may be used as an IR (infrared) window in an excellent manner. In this case, nearly all light above a range of 1100 nanometers is transmitted.

Silicon may be used as an IR window. At a wavelength of greater than 1000 nanometers silicon begins to become transparent and increasingly absorbs less light. Since the interface air/silicon has a reflection of more than 30 percent and a window always has two interfaces a non-treated piece of silicon transmits, despite its transparency in the infrared area, for instance only 50 percent of the incident light intensity, while the remaining half is lost by reflection.

By providing an IR window on the basis of a nanostructure as described above, the advantages are obtained that the self-organized nanostructure formed by the RIE method is an effective medium providing for a steady transition of the two material characteristics. In this manner, by modifying the silicon surface a transmission of over 90 percent may be obtained in the infrared range. The modified surface acts such that the interface characteristics between silicon and air or vacuum are changed such that no step in the impedance occurs but the different impedances steadily blend into each other. Furthermore the material for the desired wavelength range is not absorbing. The interface modification of the silicon provides for the suppression of reflection and thus for the enhanced transmission.

An important aspect is the pin-type structure of the surface. The structures form an effective medium that provides for the steady transition of the two material characteristics. A surface modification at one surface already provides a transmission of approximately 70 percent.

In FIG. 7 the transparency of a sample having a modified surface at both surfaces is illustrated. For infrared light of 1200 nm and higher the theoretical value of 70 percent is realized.

One issue for a double sided surface modification is the low mechanical strength of the produced structures so that the handling of the window is difficult.

The surface modification may be restricted by conventional photo resist masking techniques to specific areas so that mechanically stressed areas may be separated from optically transparent areas. In this manner, the disadvantage of the difficult handling is avoided, a stable and if required an air-tight, liquid tight or vacuum tight installation of such a window is thus possible without problems.

One embodiment relates to an optical window made of silicon having an improved broadband transparency in the IR range, wherein at least one of the two surfaces comprises pin-type structures with nano dimensions having a high aspect ratio of greater than 4:1 formed by the RIE method by using the working gases oxygen and $SF_6$ in a single process step in a self-organizing manner, as described above.

Also both surfaces of the window may be provided with pyramid-like pins.

In a further embodiment the nanostructures are protected with respect to mechanical damage by an SOG layer (spin-on glass).

In a further embodiment the protection consists of hydrogensilsesquioxane (HSQ). In a further embodiment the reflection reducing nano patterning is restricted by means of conventional masking techniques to specific areas of the window so as to provide non-treated mechanically stable and simply sealable areas with respect to air, liquid and vacuum.

We claim:

1. A method for adapting an index of refraction of an optically active window of a photo electronic device, wherein the method comprises:
   producing a nanostructure in a surface area of the window by means of a self-organized plasma etch process for etching a silicon base layer; and
   adjusting an aspect ratio of structural elements of the nanostructure formed in the silicon base layer to a value of 4 or higher depending on an operating wavelength range of the photo electronic device;
   the structural elements are formed as pin-type structural elements during the plasma etch process by using the working gases oxygen ($O_2$) and sulphur hexafluorine ($SF_6$) without application of additional means for a certain mask formation in a single process step, wherein the silicon base layer is maintained at a constant temperature in the range of 27° C.±5° C. during the process and wherein a plasma power in the range of approximately 100 to 300 Watt is used, wherein a higher plasma power is required at higher process pressures and the ratio of the working gas flow rates is adjusted in correlation to the geometrical tool parameters such that the oxygen exhibits a self-masking effect on the silicon base layer at the point of reaction, which is accomplished in a range of the gas flow rates for $SF_6$ of 50 to 150 sccm and for $O_2$ of 20 to 200 sccm and wherein the process time is only a few minutes.

2. The method according to claim 1, further comprising: forming a protection layer for the nanostructure with a substantially planar surface.

3. A method for a method according to claim 1, wherein one additional layer is applied prior to a plasma etch process as a buffer layer that has a different etch behavior with respect to the silicon base layer for the same process parameters such that a self-organized structure with relatively low aspect ratio is created and is reduced during the advance of the process.

4. The method according to claim 2, wherein a spin-on glass (SOG) material having characteristics adapted to the requirements of the nanostructure to be passivated is applied in several steps and is annealed after each application until the planar surface is formed.

5. The method according to claim 4, wherein SOG layers comprised of hydrogensilsesquioxane (HSQ) are applied.

6. The method according to claim 3, wherein the aspect ratio of the structural elements of the nanostructure is adjusted by means of the thickness of the buffer layer.

7. The method according to claim 3, wherein the buffer layer is an $SiO_2$ layer.

8. The method according to claim 3, wherein the buffer layer has a thickness of 20 nm to 100 nm.

9. The method according to claim 3, wherein the buffer layer is not completely removed.

* * * * *